United States Patent
Fukuzawa

(10) Patent No.: US 10,218,375 B2
(45) Date of Patent: Feb. 26, 2019

(54) CIRCUIT DEVICE, OSCILLATOR, ELECTRONIC APPARATUS, AND VEHICLE

(71) Applicant: Seiko Epson Corporation, Tokyo (JP)

(72) Inventor: Akihiro Fukuzawa, Hino (JP)

(73) Assignee: Seiko Epson Corporation (JP)

( * ) Notice: Subject to any disclaimer, the term of this patent is extended or adjusted under 35 U.S.C. 154(b) by 289 days.

(21) Appl. No.: 15/296,388

(22) Filed: Oct. 18, 2016

(65) Prior Publication Data

US 2017/0115709 A1    Apr. 27, 2017

(30) Foreign Application Priority Data

Oct. 27, 2015  (JP) ................................ 2015-211252
May 18, 2016  (JP) ................................ 2016-099724

(51) Int. Cl.
*H03M 1/46*  (2006.01)
*H03M 1/06*  (2006.01)
*H03K 3/011*  (2006.01)
*H04L 7/00*  (2006.01)

(52) U.S. Cl.
CPC ............. *H03M 1/46* (2013.01); *H03K 3/011* (2013.01); *H03M 1/06* (2013.01); *H04L 7/00* (2013.01); *G05B 2219/50333* (2013.01)

(58) Field of Classification Search
None
See application file for complete search history.

(56) References Cited

U.S. PATENT DOCUMENTS

2002/0149503 A1* 10/2002 Lautzenhiser .......... H03L 7/189
                                                                    341/17
2007/0268167 A1* 11/2007 Ide ........................ H03K 3/011
                                                                   341/118

FOREIGN PATENT DOCUMENTS

| JP | 64-082809 A | 3/1989 |
| JP | 06-326598 A | 11/1994 |
| JP | 2003-152449 A | 5/2003 |
| JP | 2012-199631 A | 10/2012 |

* cited by examiner

*Primary Examiner* — Tuan C Dao
(74) *Attorney, Agent, or Firm* — Harness, Dickey & Pierce, P.L.C.

(57) ABSTRACT

A circuit device includes an A/D conversion unit that performs A/D conversion of a temperature detection voltage applied from a temperature sensor unit and outputs temperature detection data, a processing unit that performs a temperature compensation process of an oscillation frequency on the basis of the temperature detection data, and an oscillation signal generation circuit that includes a D/A conversion unit and an oscillation circuit and generates an oscillation signal using frequency control data received from the processing unit and a vibrator. The D/A conversion unit includes modulation circuit that receives the frequency control data of (n+m) bits and modulates n-bit data on the basis of m-bit data of the frequency control data, a D/A converter that performs D/A conversion of the modulated n-bit data, and a filter circuit that smoothes the output voltage of the D/A converter.

20 Claims, 26 Drawing Sheets

CIRCUIT DEVICE, OSCILLATOR, ELECTRONIC APPARATUS, AND VEHICLE

BACKGROUND

1. Technical Field

The present invention relates to a circuit device, an oscillator, an electronic apparatus, a vehicle, and the like.

2. Related Art

Hitherto, temperature-compensated oscillators called temperature compensated crystal oscillators (TCXO) have been known. The TCXO is used as a reference signal source or the like in, for example, a portable communication terminal, a GPS-related device, a wearable device, an on-vehicle device, or the like.

The TCXO includes an ATCXO which is an analog type temperature-compensated oscillator and a DTCXO which is a digital type temperature-compensated oscillator. As the related art of the ATCXO, a technique disclosed in JP-A-2012-199631 is known. As the related art of the DTCXO, a technique disclosed in JP-A-64-82809 is known.

A digital type oscillator such as a DTCXO has advantages in terms of low power consumption and the like, as compared to an analog type oscillator such as an ATCXO. For example, in the ATCXO, a large amount of current to be consumed flows in an analog circuit of a circuit device thereof. Particularly, in the ATCXO, when there is an attempt to increase the order of an approximation function in a temperature compensation circuit (approximation function generation circuit) which is an analog circuit or reduce noise by increasing a current flowing to a transistor of an analog circuit in order to improve frequency accuracy, power consumption is drastically increased. For this reason, there is a problem that it is difficult to realize both an improvement in frequency accuracy and low power consumption.

SUMMARY

An advantage of some aspects of the invention is to provide a circuit device, an oscillator, an electronic apparatus, a vehicle, and the like which are capable of realizing both an improvement in frequency accuracy and low power consumption.

An aspect of the invention relates to a circuit device including an A/D conversion unit that performs A/D conversion of a temperature detection voltage applied from a temperature sensor unit and outputs temperature detection data, a processing unit that performs a temperature compensation process of an oscillation frequency based on the temperature detection data and outputs frequency control data of the oscillation frequency, and an oscillation signal generation circuit that generates an oscillation signal having the oscillation frequency which is set based on the frequency control data, using the frequency control data received from the processing unit and a vibrator, wherein the oscillation signal generation circuit includes a D/A conversion unit that performs D/A conversion of the frequency control data received from the processing unit, and an oscillation circuit that generates the oscillation signal using an output voltage of the D/A conversion unit and the vibrator, and wherein the D/A conversion unit includes a modulation circuit that receives the frequency control data of i=(n+m) bits from the processing unit and modulates n-bit data of the frequency control data based on m-bit data of the frequency control data, a D/A converter that performs D/A conversion of the modulated n-bit data, and a filter circuit that smooths the output voltage of the D/A converter.

According to the aspect of the invention, it is possible to realize the D/A conversion unit with a high resolution of i=(n+m) bits while using, for example, the D/A converter with a resolution of n bits by only providing the modulation circuit and the filter circuit in the D/A conversion unit. In this manner, the resolution of the D/A conversion unit performing D/A conversion of frequency control data is increased, and thus it is possible to realize an increase in a frequency accuracy of an oscillation signal generated based on the frequency control data. In addition, an increase in power consumption caused by the provision of the modulation circuit and the filter circuit is not so great. In addition, it is not so difficult to supply, for example, frequency control data of i bits to the D/A conversion unit from the processing unit. Therefore, according to the aspect of the invention, it is possible to provide the circuit device capable of realizing both an improvement in frequency accuracy and low power consumption.

In the aspect of the invention, a relation of $\Delta f/fs < 1/10^6$ may be established in a case where a sampling frequency of the D/A conversion unit is set to be fs and a change in the oscillation frequency due to one D/A conversion of the D/A conversion unit is set to be $\Delta f$.

In the aspect of the invention with this configuration, the sampling frequency fs of the D/A conversion unit and the change $\Delta f$ in the oscillation frequency due to one D/A conversion of the D/A conversion unit satisfy the relation of $\Delta f/fs < 1/10^6$. Thereby, it is also possible to suppress the degradation of C/N characteristics due to spuriousness caused by a fluctuation in frequency control data.

In the aspect of the invention, a relation of $\Delta f/fs < 1/10^6$ may be established when a relation of $fs \geq 1$ kHz is established, and a relation of $\Delta f < 1$ mHz may be established when a relation of $fs < 1$ kHz is established.

With this configuration, it is possible to use appropriate conditions depending on fs in order to suppress degradation of C/N characteristics.

In the aspect of the invention, a relation of $\Delta f < 1$ mHz may be established when a relation of $fs < 1$ kHz is established in a case where a sampling frequency of the D/A conversion unit is set to be fs and a change in the oscillation frequency due to one D/A conversion of the D/A conversion unit is set to be $\Delta f$.

In the aspect of the invention with this configuration, the sampling frequency fs of the D/A conversion unit and a change $\Delta f$ in an oscillation frequency due to one D/A conversion of the D/A conversion unit satisfy the relation of $\Delta f < 1$ mHz in a case where the relation of $fs < 1$ kHz is established. Thereby, it is also possible to suppress the degradation of C/N characteristics due to spuriousness caused by a fluctuation in frequency control data.

In the aspect of the invention, the vibrator may be a quartz crystal vibrator.

With this configuration, it is possible to use the quartz crystal vibrator as the vibrator.

In the aspect of the invention, the quartz crystal vibrator may be an AT cut vibrator, an SC cut vibrator, or a surface acoustic wave (SAW) resonator.

With this configuration, it is possible to use at least one of a plurality of vibrators (resonators) having different characteristics, as the quartz crystal vibrator.

In the aspect of the invention, the processing unit may output the frequency control data changing from first data corresponding to first temperature to second data corresponding to second temperature in units of k×LSB (k≥1) in a case where temperature changes from the first temperature to the second temperature.

With this configuration, even when temperature changes from the first temperature to the second temperature, frequency control data changing in units of k×LSB is input to the D/A conversion unit from the processing unit. Therefore, when temperature changes from the first temperature to the second temperature, a great voltage change occurs in an output voltage of the D/A conversion unit, and thus it is possible to effectively suppress the occurrence of a defect caused by the voltage change.

In the aspect of the invention, the processing unit may compare the first data which is arithmetic operation result data of the temperature compensation process of the last time with the second data which is arithmetic operation result data of the temperature compensation process of this time, may output addition result data as the frequency control data while performing a process of adding a predetermined value to the first data until the addition result data reaches the second data, in a case where the second data is larger than the first data, and may output subtraction result data as the frequency control data while performing a process of subtracting a predetermined value from the first data until the subtraction result data reaches the second data, in a case where the second data is smaller than the first data.

With this configuration, it is possible to change frequency control data in units of k×LSB by performing a process of adding a predetermined value to the first data or performing a process of subtracting a predetermined value from the first data.

In the aspect of the invention, the processing unit may include an arithmetic operation unit that performs an arithmetic operation of the temperature compensation process of the oscillation frequency based on the temperature detection data and outputs the arithmetic operation result data of the temperature compensation process, and an output unit that receives the arithmetic operation result data from the arithmetic operation unit and outputs the frequency control data. The output unit may output the frequency control data changing from the first data to the second data in units of k×LSB in a case where the arithmetic operation result data changes from the first data corresponding to the first temperature to the second data corresponding to the second temperature.

With this configuration, the temperature compensation process of an oscillation frequency is realized by an arithmetic operation process of the arithmetic operation unit. In a case where arithmetic operation result data received from the arithmetic operation unit changes from first data to second data, the output unit outputs frequency control data changing from the first data to the second data in units of k×LSB. In this manner, in a case where temperature changes from first temperature to second temperature, frequency control data changing from the first data corresponding to the first temperature to the second data corresponding to the second temperature in units of k×LSB can be output from the processing unit.

In the aspect of the invention, the processing unit may output the frequency control data at an output rate higher than an output rate of the temperature detection data received from the A/D conversion unit.

With this configuration, it is possible to sequentially change frequency control data in units of k×LSB, for example, within an A/D conversion period of the A/D conversion unit.

In the aspect of the invention, the D/A conversion unit may output the output voltage changing with a step width of a voltage corresponding to k×LSB (k≥1) in a case where a minimum resolution of data in D/A conversion is set to be LSB.

With this configuration, a change in the output voltage of the D/A conversion unit is restricted to a step width of a voltage corresponding to k×LSB, and thus it is possible to suppress the occurrence of a defect caused by a great voltage change occurring in the output voltage.

In the aspect of the invention, a relation of k=1 may be established.

With this configuration, it is possible to change an output voltage of the D/A conversion unit with a step width of a voltage corresponding to 1 LSB.

Another aspect of the invention relates to an oscillator including any of the circuit devices described above and the vibrator.

Still another aspect of the invention relates to an electronic apparatus including any of the circuit devices described above.

Yet another aspect of the invention relates to a vehicle including any of the circuit devices described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention will be described in detail. Meanwhile, the present embodiment to be described below does not unduly limit the content of the invention described in the appended claims, and not all of the features described in the present embodiment are essential as solving means of the invention.

1. Frequency Drift

In a TCXO which is a temperature-compensated oscillator, there are demands for an improvement in a frequency accuracy and low power consumption. For example, in a wearable device such as a GPS built-in timepiece or a device measuring biological information such as a pulse wave, it is necessary to increase an operation continuation time based on a battery. For this reason, the TCXO serving as a reference signal source is required to achieve lower power consumption while securing frequency accuracy.

In addition, various methods are proposed as a communication method between a communication terminal and a base station. For example, in a time division duplex (TDD) method, each device transmits data in an allocated time slot. A guard time is set between the time slots (uplink slot, downlink slot) to thereby prevent the time slots from overlapping each other. In a next-generation communication system, for example, it is proposed that data communication is performed on the basis of a TDD method using one frequency band (for example, 50 GHz).

However, in a case where such a TDD method is adopted, it is necessary to perform time synchronization in each device, and thus an absolute time is required to be accurately clocked. In order to realize such a demand, for example, a method of providing an atomic timepiece (atomic oscillator) as a reference signal source in each device is also considered, which results in a problem such as an increase in the cost of the device or an increase in the size of the device.

In addition, the TCXO includes an ATCXO which is an analog type temperature-compensated oscillator and a DTCXO which is a digital type temperature-compensated oscillator.

Figure 1:
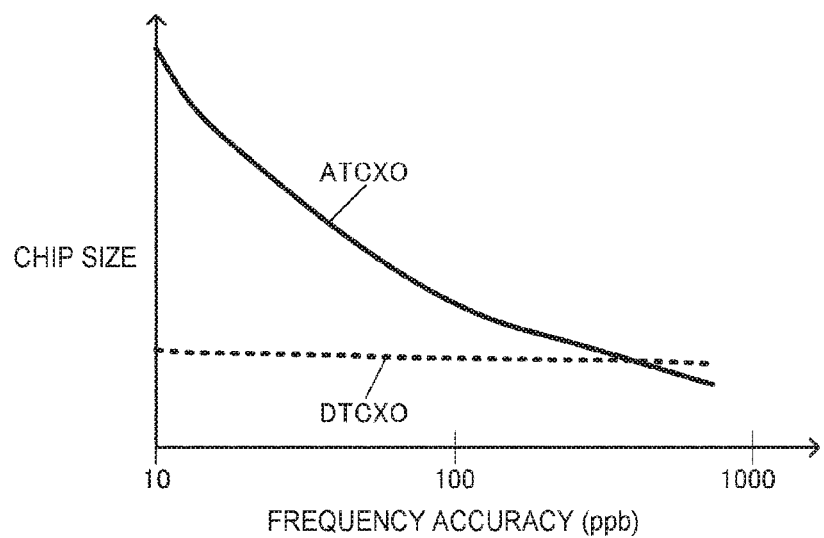
FIG. 1 is a diagram showing a relationship between a frequency accuracy and a chip size.

When there is an attempt to increase frequency accuracy in a case where the ATCXO is used as a reference signal source, a chip size of a circuit device is increased as shown in FIG. 1, and thus it is difficult to realize reductions in costs and power consumption.

On the other hand, in the DTCXO, there is an advantage in that it is possible to realize an increase in frequency accuracy without increasing a chip size of a circuit device to that extent as shown in FIG. 1.

However, in a digital type oscillator such as a DTCXO, there is a problem in that a communication error and the like may occur in a communication device having an oscillator embedded therein due to a frequency drift of the oscillation frequency thereof. For example, in the digital type oscillator, A/D conversion of a temperature detection voltage detected by a temperature sensor unit is performed, and a temperature compensation process of frequency control data is performed on the basis of temperature detection data obtained, thereby generating an oscillation signal on the basis of the frequency control data. In this case, when the value of the frequency control data greatly changes due to a change in temperature, it is found that a problem of frequency hopping occurs due to the great change in the value of the frequency control data. When such frequency hopping occurs, a problem such as unlocking of a GPS may occur in a case where a communication device related to a GPS is taken as an example.

For this reason, in a digital type oscillator such as a DTCXO, various circuit systems are proposed. However, in the present situation, as a reference signal source of a real product having such a communication error problem, a digital type oscillator is not almost adopted, and an analog type oscillator such as an ATCXO is adopted.

Figure 2:
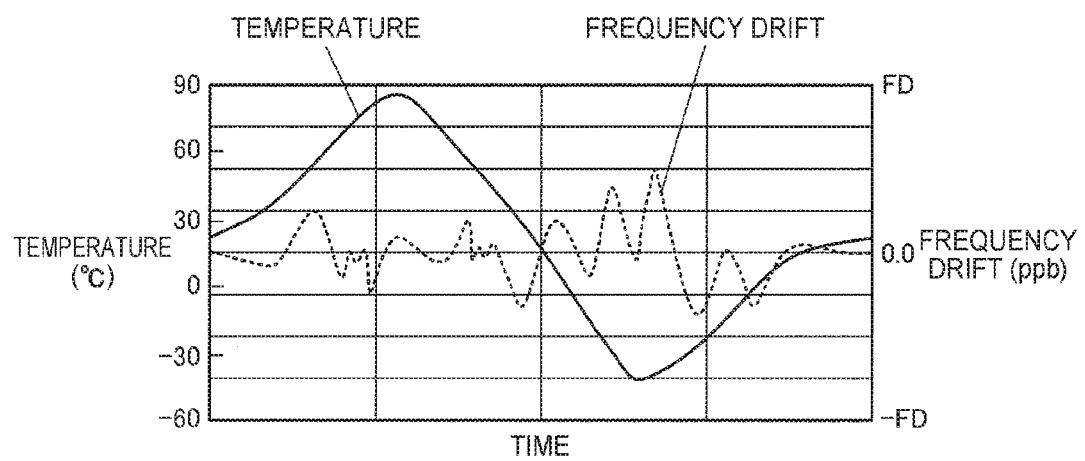
FIG. 2 is a diagram showing a frequency drift of an ATCXO.

For example, FIG. 2 is a diagram showing a frequency drift of an ATCXO. In the ATCXO, even when temperature changes as time elapses as shown in FIG. 2, the frequency drift thereof falls within a range (±FD) of a permissible frequency drift (permissible frequency error). In FIG. 2, the frequency drift (frequency error) is represented by a ratio (frequency accuracy. ppb) with respect to a nominal oscillation frequency (for example, approximately 16 MHz). For example, in order to prevent the occurrence of a communication error, it is necessary to make a frequency drift fall within a range (±FD) of a permissible frequency drift within a predetermined period of time TP (for example, 20 msec). Here, the FD is, for example, approximately several ppb.

Figure 3:
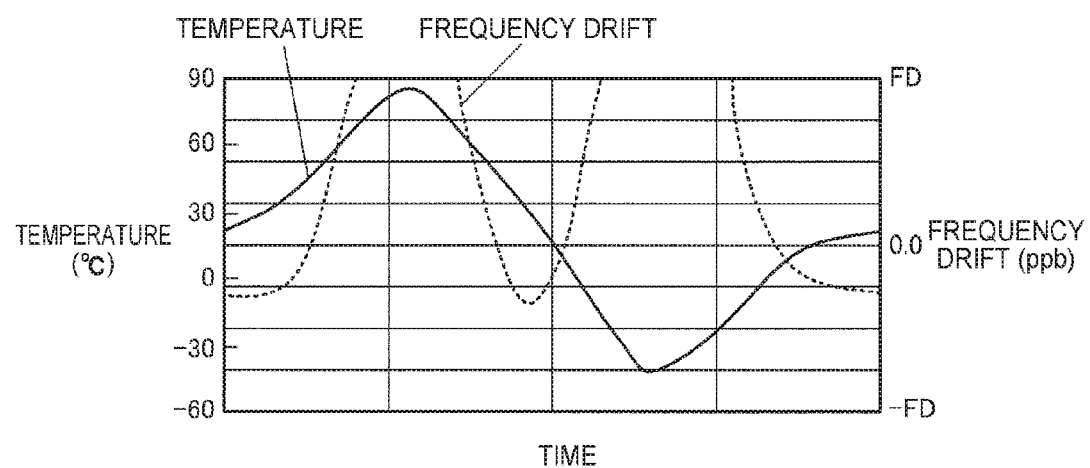
FIG. 3 is a diagram showing a frequency drift of a DTCXO of the related art.

On the other hand, FIG. 3 is a diagram showing a frequency drift in a case where a DTCXO of the related art is used. As shown in FIG. 3, in the DTCXO of the related art, the frequency drift does not fall within a range of a permissible frequency drift, which results in frequency hopping in which the frequency drift falls outside the range. For this reason, a communication error (unlocking of a GPS, or the like) which results from the frequency hopping occurs, which causes a disturbance in adopting a DTCXO as a reference signal source of a real product.

In addition, it is known that an oscillator generates phase noise based on characteristics of a vibrator. D1 of FIG. 16 to be described later is an example of general C/N characteristics of a quartz crystal vibrator, and the intensity (vertical axis, unit of dBc/Hz) of phase noise is in inverse proportion to the cube of a detuning frequency f at a location where a detuning frequency (horizontal axis, unit of Hz) with respect to an oscillation frequency is low, and is in inverse proportion to the square of f in a range of approximately 1 k to 10 kHz. In a frequency range of 10 kHz or less, a great influence is exhibited due to so-called 1/f noise. On the other hand, in a frequency of higher than 10 kHz, an influence due to thermal noise is great, thereby obtaining a flat characteristic that does not depend on f. In other words, the generation of a signal serving as a frequency other than a desired oscillation frequency is inevitable in terms of characteristics of a vibrator. In an oscillator such as a DTCXO (and a circuit device including an oscillator), a design is made which does not cause a problem even when phase noise serving as C/N characteristics such as D1 is generated.

Figure 16:
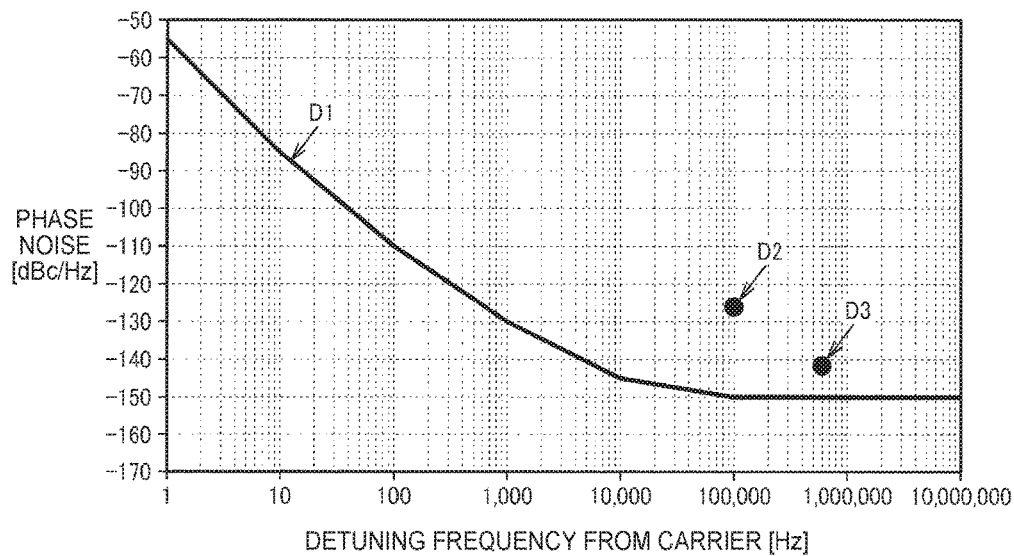
FIG. 16 is a diagram showing a relationship between C/N characteristics of a vibrator and spuriousness degrading the C/N characteristics.

However, in the DTCXO, spuriousness having an intensity depending on an output frequency fs of data (frequency control data DDS) which controls an oscillation frequency and a change $\Delta f$ in the oscillation frequency occurs. Details thereof will be described using the following Expression (10) and the like. In the occurring spuriousness, a detuning frequency with respect to a fundamental wave (oscillation frequency) is fs, and an intensity has a value depending on $(\Delta f/fs)^2$. There is the possibility that spuriousness having a larger intensity than that of the original phase noise of the oscillator shown in D1 occurs depending on values of fs and $\Delta f$. D2 of FIG. 16 is an example of spuriousness in a case where $\Delta f=0.1$ Hz and fs=100 kHz, and D3 is an example of spuriousness in a case where $\Delta f=0.1$ Hz and fs=600 kHz. Both the spuriousness of D2 and D3 have intensities higher than that of the phase noise (D1) of the original oscillator.

A signal intensity in a frequency different from a desired oscillation frequency becomes relatively large due to the occurrence of spuriousness as shown in D2 or D3, and thus C/N characteristics of the oscillator 400 are degraded. The degradation of the C/N characteristics leads to a deterioration in the accuracy of data acquired using an oscillation signal. For example, in the case of the above-mentioned GPS, the accuracy of a GPS received signal is reduced, and specifically, the accuracy of positional information obtained from the GPS received signal is reduced. In this manner, the occurrence of spuriousness due to a fluctuation in frequency is an obstacle to the adoption of a DTCXO as a reference signal source of a real product. Meanwhile, the spuriousness shown in D2 and D3 of FIG. 16 degrade C/N characteristics in a case where the intensities thereof are not reduced. Accordingly, in a case where a noise reduction process of reducing the intensity of spuriousness, such as smoothing using a filter circuit, the adoption of values of $\Delta f$ and fs corresponding to D2 or D3 is not obstructed in the method of this embodiment. Details thereof will be described later.

2. Configuration

Figure 4:
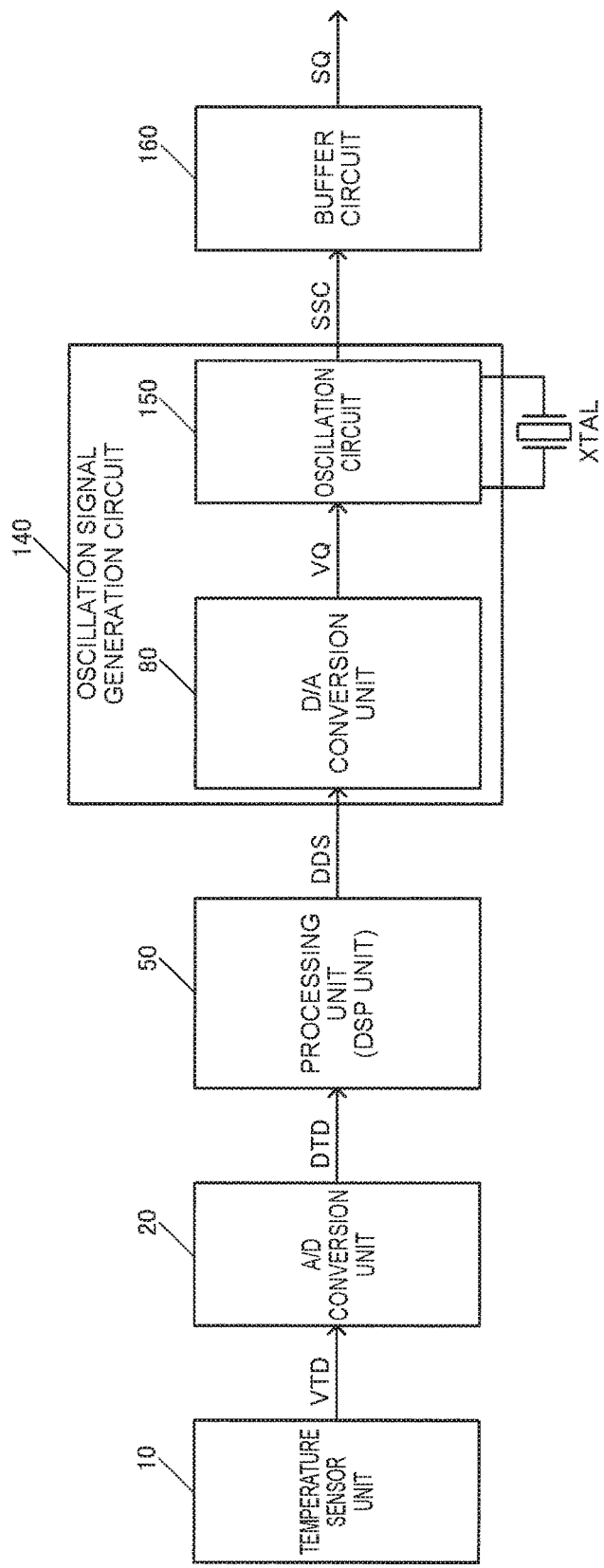
FIG. 4 shows an example of a basic configuration of a circuit device of this embodiment.

FIG. 4 shows an example of a basic configuration of a circuit device of this embodiment. The circuit device is a circuit device (semiconductor chip) which realizes a digital type oscillator such as a DTCXO or an OCXO. For example, a digital type oscillator is realized by accommodating the circuit device and a vibrator XTAL in a package.

The circuit device of FIG. 4 includes an A/D conversion unit 20, a processing unit 50, and an oscillation signal generation circuit 140. In addition, the circuit device may include a temperature sensor unit 10 and a buffer circuit 160. Meanwhile, the configuration of the circuit device is not limited to the configuration shown in FIG. 4, and may be modified in various ways such as the omission of some components (for example, the temperature sensor unit, the buffer circuit, the A/D conversion unit, and the like) or the addition of other components.

The vibrator XTAL is a piezoelectric vibrator such as a quartz crystal vibrator. The vibrator XTAL may be an oven type vibrator (OCXO) which is provided within a thermostatic chamber. The vibrator XTAL may be a resonance device (an electromechanical resonator or an electrical resonance circuit). A piezoelectric vibrator, a surface acoustic wave (SAW) resonator, a micro electro mechanical system (MEMS) vibrator, or the like can be adopted as the vibrator XTAL. Examples of a substrate material to be used of the vibrator XTAL include piezoelectric monocrystal such as quartz crystal, lithium tantalate, or lithium niobate, a piezoelectric material such as piezoelectric ceramics, for example, zirconate titanate, a silicon semiconductor material, and the like. As an excitation unit of the vibrator XTAL, an excitation unit using a piezoelectric effect may be used, and electrostatic driving using a Coulomb's force may be used.

The temperature sensor unit 10 outputs a temperature detection voltage VTD. Specifically, a temperature dependent voltage changing depending on the temperature of an environment (circuit device) is output as the temperature detection voltage VTD. A specific configuration example of the temperature sensor unit 10 will be described later.

The A/D conversion unit 20 performs A/D conversion of a temperature detection voltage VTD which is output from the temperature sensor unit 10 to thereby output temperature detection data DTD. For example, digital temperature detection data DTD (A/D result data) corresponding to a result of the A/D conversion of the temperature detection voltage VTD is output. For example, a successive comparison method, a method similar to the successive comparison method, or the like can be adopted as an A/D conversion method of the A/D conversion unit 20. Meanwhile, the A/D conversion method is not limited to the methods, and various methods (a counting type, a parallel comparison type, a serial-parallel type, or the like) can be adopted.

The processing unit 50 (DSP unit: digital signal processing unit) performs a variety of signal processing. For example, the processing unit 50 (temperature compensation unit) performs a temperature compensation process of an oscillation frequency (frequency of an oscillation signal) on the basis of temperature detection data DTD. The processing unit outputs frequency control data DDS of an oscillation frequency. Specifically, the processing unit 50 performs a temperature compensation process for making an oscillation frequency constant even when temperature changes, on the basis of temperature detection data DTD (temperature dependent data) which changes depending on temperature, coefficient data for a temperature compensation process (coefficient data of an approximation function), and the like. The processing unit 50 may be realized by an ASIC circuit such as a gate array, or may be realized by a processor and a program operating on the processor.

The oscillation signal generation circuit 140 generates an oscillation signal SSC. For example, the oscillation signal generation circuit 140 generates an oscillation signal SSC of the oscillation frequency which is set on the basis of frequency control data DDS using the frequency control data DDS and the vibrator XTAL that are output from the processing unit 50. As an example, the oscillation signal generation circuit 140 oscillates the vibrator XTAL with an oscillation frequency which is set on the basis of the frequency control data DDS to thereby generate an oscillation signal SSC.

Meanwhile, the oscillation signal generation circuit 140 may be a circuit that generates an oscillation signal SSC by a direct digital synthesizer method. For example, an oscillation signal SSC of an oscillation frequency which is set on the basis of the frequency control data DDS may be digitally generated using an oscillation signal of the vibrator XTAL (oscillation source of a fixed oscillation frequency) as a reference signal.

The oscillation signal generation circuit 140 may include a D/A conversion unit 80 and an oscillation circuit 150. However, the oscillation signal generation circuit 140 is not limited to such a configuration, and may be modified in various ways such as the omission of some components or the addition of other components.

The D/A conversion unit 80 performs D/A conversion of frequency control data DDS (output data of the processing unit) which is output from the processing unit 50. The frequency control data DDS which is input to the D/A conversion unit 80 is frequency control data (frequency control code) after a temperature compensation process is performed by the processing unit 50. For example, a resistor string type (resistance separation type) can be adopted as a D/A conversion method of the D/A conversion unit 80. However, the D/A conversion method is not limited thereto, and various methods such as a resistor ladder type (R-2R ladder type or the like), a capacity array type, and a pulse width modulated type may be adopted. In addition, the D/A conversion unit 80 may include the control circuit thereof, a modulation circuit, a filter circuit, or the like, other than a D/A converter.

The oscillation circuit 150 generates an oscillation signal SSC using an output voltage VQ of the D/A conversion unit 80 and the vibrator XTAL. The oscillation circuit 150 is connected to the vibrator XTAL through terminals for first and second vibrators (pads for vibrators). For example, the oscillation circuit 150 oscillates the vibrator XTAL (a piezoelectric vibrator, a resonator, or the like) to thereby generate an oscillation signal SSC. Specifically, the oscillation circuit 150 oscillates the vibrator XTAL with an oscillation frequency in which the output voltage VQ of the D/A conversion unit 80 is used as a frequency control voltage (oscillation control voltage). For example, in a case where the oscillation circuit 150 is a circuit (VCO) that controls the oscillation of the vibrator XTAL by the control of a voltage, the oscillation circuit 150 may include a variable capacitor (varicap or the like) of which the capacitance value changes depending on a frequency control voltage.

Meanwhile, as described above, the oscillation circuit 150 may be realized by a direct digital synthesizer method. In this case, an oscillation frequency of the vibrator XTAL is set to be a reference frequency, which is different from an oscillation frequency of the oscillation signal SSC.

The buffer circuit 160 performs buffering of an oscillation signal SSC generated by the oscillation signal generation circuit 140 (oscillation circuit 150) and outputs a signal SQ obtained by the buffering. That is, the buffer circuit performs buffering for allowing an external load to be sufficiently driven. The signal SQ is, for example, a clipped sine wave signal. However, the signal SQ may be a rectangular wave signal. Alternatively, the buffer circuit 160 may be a circuit capable of outputting both a clipped sine wave signal and a rectangular wave signal as the signal SQ.

Figure 5:
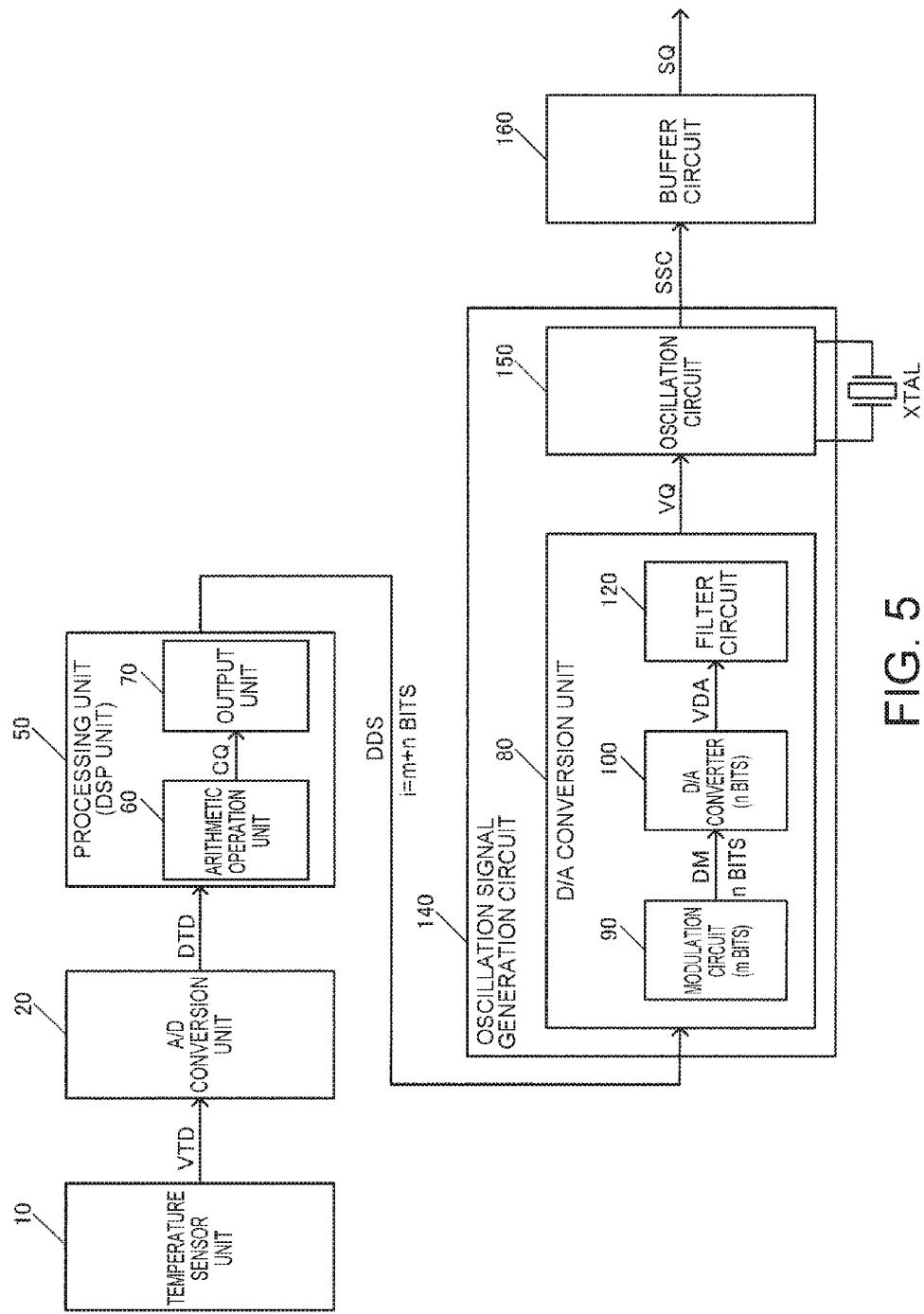
FIG. 5 shows an example of a detailed configuration of the circuit device of this embodiment.

FIG. 5 shows an example of a detailed configuration of the circuit device of this embodiment. In FIG. 5, the D/A conversion unit 80 includes a modulation circuit 90, a D/A converter 100, and a filter circuit 120.

The modulation circuit 90 of the D/A conversion unit 80 receives frequency control data DDS of i=(n+m) bits from the processing unit 50 (i, n, and m are integers of 1 or greater). As an example, i=20, n=16, and m=4 are exemplified. The modulation circuit 90 modulates n-bit (for example, 16-bit) data of the frequency control data DDS on the basis of m-bit (for example, 4-bit) data of the frequency control data DDS. Specifically, the modulation circuit 90 performs PWM modulation of the frequency control data DDS. Meanwhile, a modulation method of the modulation circuit 90 is not limited to PWM modulation (pulse width modulation), and may be pulse modulation such as PDM modulation (pulse density modulation) or may be a modulation method other than the pulse modulation. For example, bit extension (bit extension from n bits to i bits) may be realized by performing dither processing (dithering processing) of m bits on the n-bit data of the frequency control data DDS.

The D/A converter 100 performs D/A conversion of the n-bit data which is modulated by the modulation circuit 90. For example, the D/A converter performs D/A conversion of data of n=16 bits. For example, a resistor string type, a resistor ladder type, or the like may be adopted as a D/A conversion method of the D/A converter 100.

The filter circuit 120 smooths an output voltage VDA of the D/A converter 100. For example, the filter circuit performs low pass filtering to thereby smooth the output voltage VDA. For example, PWM demodulation of the signal having subjected to PWM modulation can be performed by providing the filter circuit 120. A cut-off frequency of the filter circuit 120 can be set depending on the frequency of PWM modulation of the modulation circuit 90. That is, since a signal of an output voltage VDA which is output from the D/A converter 100 includes a reference frequency of the PWM modulation and a ripple of a harmonic component, the ripple is attenuated by the filter circuit 120. Meanwhile, a passive filter using a passive element such as a resistor or a capacitor may be used as the filter circuit 120. However, an active filter such as an SCF may also be used as the filter circuit 120.

As described later, it is necessary to increase the resolution of the D/A conversion unit 80 in order to suppress the occurrence of a communication error caused by frequency hopping described in FIG. 3 and to achieve an improvement in frequency accuracy.

However, for example, it is difficult to realize high-resolution D/A conversion such as i=20 bits only with the D/A converter 100 of a resistor string type or the like. In addition, when the output noise of the D/A conversion unit 80 is great, it is difficult to realize an improvement infrequency accuracy due to the noise.

Consequently, in FIG. 5, the modulation circuit 90 is provided in the D/A conversion unit 80. In addition, the processing unit 50 outputs frequency control data DDS of i=m+n bits which is larger in number than n bits (for example, 16 bits) which is the resolution of the D/A converter 100. Since the processing unit 50 performs a floating-point arithmetic operation or the like in order to realize digital signal processing such as a temperature compensation process, it is easy to output the frequency control data DDS of i=m+n bits which is larger in number than n bits (for example, n=16 bits).

The modulation circuit 90 performs modulation (PWM modulation or the like) of n-bit data in i=m+n on the basis of m-bit data in i=m+n, and outputs the modulated data DM of n bits to the D/A converter 100. The D/A converter 100 performs D/A conversion of the data DM, and the filter circuit 120 performs a smoothing process of an output voltage VDA obtained, thereby allowing high-resolution D/A conversion such as i=m+n bits (for example, 20 bits) to be realized.

According to such a configuration, for example, a resistor string type with a little output noise or the like can be adopted as the D/A converter 100, and thus it is possible to reduce output noise of the D/A conversion unit 80 and to facilitate the suppression of a deterioration in frequency accuracy. For example, noise is generated due to modulation in the modulation circuit 90, but it is possible to sufficiently attenuate the noise by the setting of a cut-off frequency of the filter circuit 120 and to suppress a deterioration in frequency accuracy which is caused by the noise.

Meanwhile, the resolution of the D/A conversion unit 80 is not limited to i=20 bits, and may be higher or lower than 20 bits. In addition, the number of bits of modulation of the modulation circuit 90 is not limited to m=4 bits, and may be larger (for example, m=8 bits) or smaller than 4 bits.

In addition, in FIG. 5, the processing unit 50, performing digital signal processing such as a temperature compensation process, being provided at the front stage of the D/A conversion unit 80 is effectively utilized. That is, the processing unit 50 performs digital signal processing such as a temperature compensation process with a high level of accuracy using, for example, a floating-point arithmetic operation or the like. Therefore, for example, when conversion into binary data is performed by also handling lower bits of a mantissa part of a result of the floating-point arithmetic operation as effective data, it is possible to easily output frequency control data DDS with a large number of bits such as i=m+n=20 bits. Focusing on such a point in FIG. 5, the frequency control data DDS of i=m+n bits which is a large number of bits is supplied to the D/A conversion unit 80, which leads to success in realizing D/A conversion with high resolution such as i=m+n bits using the modulation circuit 90 of m bits and the D/A converter 100 of n bits.

In this manner, the resolution of the D/A conversion unit 80 is set to be high, and thus it is possible to suppress the occurrence of the above-mentioned frequency hopping. Thereby, it is possible to suppress the occurrence of a communication error which is caused by frequency hopping.

In addition, in a digital type oscillator such as a DTCXO or an OCXO, an oscillation frequency is required to have an extremely high frequency accuracy, other than such a problem of frequency hopping. For example, in the above-described TDD method, data is received and transmitted in time division using the same frequency in an uplink and a downlink, and a guard time is set between time slots allocated to respective devices. For this reason, in order to realize appropriate communication, it is necessary to perform time synchronization in each device, and an accurate absolute time is required to be clocked. For example, during the occurrence of a hold-over state where a reference signal (a GPS signal or a signal through the Internet) disappears or becomes abnormal, an absolute time is required to be accurately clocked on an oscillator side in a state where a reference signal is not present. For this reason, an oscillator used for such a device (a GPS-related device, a base station, or the like) is required to have an extremely high oscillation frequency accuracy.

In order to realize such a requirement, for example, the adoption of a method in which each device is provided with an atomic timepiece or the like leads to increases in the cost and size of the device. In addition, even when an oscillator with a high frequency accuracy is realized, it is not preferable that a circuit device used in the oscillator becomes larger and power consumption is considerably increased.

In this respect, according to the configuration of the circuit device of FIG. 5, it is possible to realize the D/A conversion unit 80 with an extremely high resolution such as i≥20 bits by only providing the modulation circuit 90 or the filter circuit 120 in the D/A conversion unit 80 and to realize an increase in the accuracy of an oscillation frequency by such an increase in resolution. An increase in a chip size of the circuit device and an increase in power consumption by the provision of the modulation circuit 90 or the filter circuit 120 are not so great. Further, since the processing unit 50 performs a temperature compensation process by a floating-point arithmetic operation or the like, it is also easy to output frequency control data DDS of, for example, i≥20 bits to the D/A conversion unit 80. Therefore, in the configuration of the circuit device of FIG. 5, there is an advantage in that it is possible to realize both an increase in the accuracy of an oscillation frequency and the suppression of increases in the size of the circuit device and power consumption.

Meanwhile, the circuit devices of FIGS. 4 and 5 can also be used as an oscillation IC in a PLL circuit including a phase comparison circuit that compares input signals based on a reference signal (a GPS signal or a signal through the Internet) and an oscillation signal with each other. In this case, for example, the processing unit 50 may perform a temperature compensation process, an aging correction process, or the like on frequency control data received from the phase comparison circuit, to thereby generate an oscillation signal by the oscillation signal generation circuit 140.

In addition, in a case where temperature changes from first temperature to second temperature, the processing unit 50 outputs frequency control data DDS changing from first data corresponding to the first temperature (first temperature detection data) to second data corresponding to the second temperature (second temperature detection data) in units of k×LSB (changing by every k×LSB). Here, the relation of k≥1 is established, and k is an integer of 1 or greater. For example, in a case where the number of bits of the frequency control data DDS (resolution of the D/A conversion unit) is set to i, the relation of k<$2^i$ is established, and k is an integer which is sufficiently smaller than $2^i$ (for example, k=1 to 8). Further, specifically, the relation of k<$2^m$ is established. For example, when k=1, the processing unit 50 outputs frequency control data DDS that changes from first data to second data in units of 1 LSB (units of 1 bit). That is, the processing unit outputs frequency control data DDS that changes while being shifted from first data toward second data by every 1 LSB (1 bit). Meanwhile, a change step width of the frequency control data DDS is not limited to 1 LSB, and may be a change step width of 2×LSB or greater such as 2×LSB, 3×LSB, 4×LSB, . . . .

For example, the processing unit 50 includes an arithmetic operation unit 60 and an output unit 70. The arithmetic operation unit 60 performs an arithmetic operation of a temperature compensation process of an oscillation frequency on the basis of temperature detection data DTD. For example, the temperature compensation process is realized by digital signal processing based on a floating-point arithmetic operation or the like. The output unit 70 receives arithmetic operation result data CQ from the arithmetic operation unit 60 and outputs frequency control data DDS. In a case where the arithmetic operation result data CQ changes from first data corresponding to first temperature to second data corresponding to second temperature, the output unit 70 performs a process of outputting the frequency control data DDS that changes from the first data to the second data in units of k×LSB.

In this manner, when the frequency control data DDS which is output from the processing unit 50 changes by every k×LSB, a great voltage change occurs in an output voltage VQ of the D/A conversion unit 80, for example, in a case where temperature changes from first temperature to second temperature, and it is possible to suppress the occurrence of frequency hopping of FIG. 3 which is caused by such a voltage change. Thereby, it is possible to prevent the occurrence of a communication error or the like due to the frequency hopping.

More specifically, the processing unit 50 compares first data which is arithmetic operation result data (CQ) of a temperature compensation process of the last time (previous timing) with second data which is arithmetic operation result data of a temperature compensation process of this time (present timing).

In a case where the second data is larger than the first data, the processing unit 50 (output unit 70) performs a process of adding a predetermined value to the first data. For example, the processing unit performs a process of adding k×LSB as the predetermined value. For example, when k=1, the processing unit performs a process of adding 1 LSB as the predetermined value. Meanwhile, the predetermined value to be added is not limited to 1 LSB, and may be 2×LSB or greater. For example, the processing unit 50 performs the addition process until addition result data reaches the second data and outputs the addition result data as frequency control data DDS.

On the other hand, in a case where second data corresponding to second temperature is smaller than first data corresponding to first temperature, the processing unit 50 (output unit 70) performs a process of subtracting a predetermined value from the first data. For example, the processing unit performs a process of subtracting k×LSB as the predetermined value. For example, when k=1, the processing unit performs a process of subtracting 1 LSB as the predetermined value. Meanwhile, the predetermined value to be subtracted is not limited to 1 LSB, and may be 2×LSB or greater. For example, the processing unit 50 performs the subtraction process until subtraction result data reaches the second data and outputs the subtraction result data as frequency control data DDS.

In this manner, when frequency control data DDS is output while performing a process of adding a predetermined value to the first data or subtracting a predetermined value from the first data, it is possible to output frequency control data DDS that changes from the first data to the second data, for example, in units of k×LSB corresponding to a predetermined value in a case where arithmetic operation result data of a temperature compensation process changes from first data corresponding to first temperature to second data corresponding to second temperature.

In addition, the processing unit 50 (output unit 70) performs a process of outputting frequency control data DDS changing in units of k×LSB in a first mode (normal mode). Thereby, it is possible to suppress the occurrence of a communication error or the like due to frequency hopping.

On the other hand, the processing unit 50 outputs arithmetic operation result data of a temperature compensation process as frequency control data DDS without performing a process of outputting frequency control data DDS changing in units of k×LSB in a second mode (high-speed mode). Specifically, the arithmetic operation result data CQ received from the arithmetic operation unit 60 is output as frequency control data DDS. In this manner, frequency control data DDS changing at higher speed than in the first mode can be supplied to the D/A conversion unit 80, and thus it is possible to realize the high-speed mode.

Meanwhile, the first mode is set during a normal operation of a circuit device (normal operation period). On the other hand, the second mode is set, for example, during the start-up of a circuit device (start-up period) or during a test (test period). That is, the circuit device is set to be in the second mode during an operation other than a normal operation.

For example, the first mode is set during a normal operation of the circuit device, and thus the processing unit 50 outputs frequency control data DDS that changes in units of k×LSB. Thereby, it is possible to prevent the occurrence of a problem such as frequency hopping and to achieve an increase in the accuracy of an oscillation frequency.

On the other hand, the second mode is set during the start-up or test of the circuit device, and thus a process of changing frequency control data DDS in units of k×LSB is not performed, thereby allowing the arithmetic operation result data CQ received from the arithmetic operation unit 60 to be output as frequency control data DDS without any change. Thereby, it is possible to reduce a start-up time of the circuit device and to rapidly start up the circuit device. In addition, it is possible to reduce a test period during the manufacture of the circuit device or the oscillator and to achieve a reduction in a manufacturing period and the like.

In addition, in this embodiment, the processing unit 50 outputs frequency control data DDS at an output rate higher than an output rate of temperature detection data DTD received from the A/D conversion unit 20. In this manner, it is possible to output frequency control data DDS that changes from first data to second data in units of k×LSB. For example, it is possible to change frequency control data DDS by every k×LSB in a stepwise manner within a period corresponding to an A/D conversion period.

Figure 6:
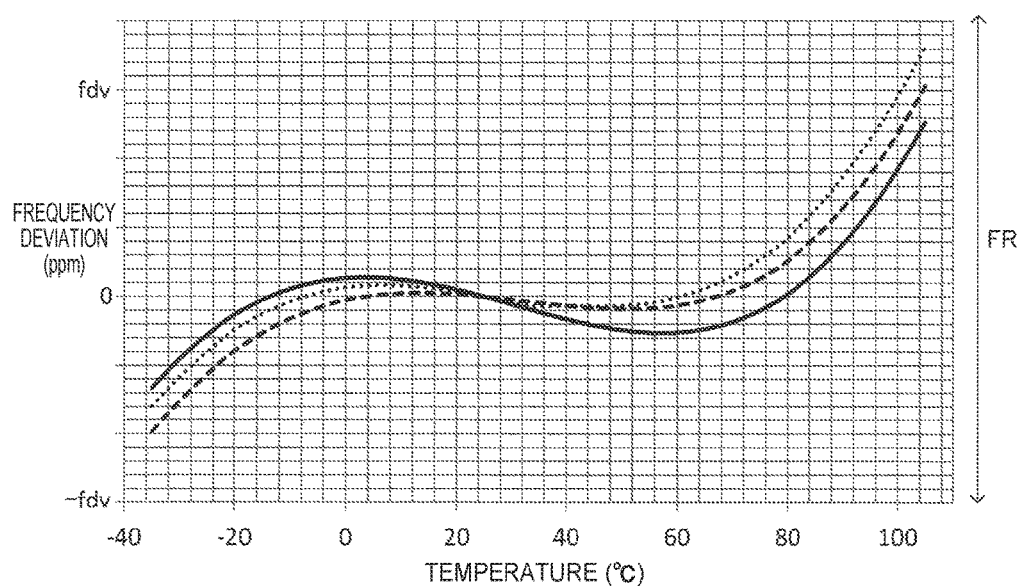
FIG. 6 is a diagram showing an example of temperature characteristics of a vibrator and the variations thereof.

FIG. 6 is a diagram showing an example of a frequency deviation of an oscillation frequency depending on the temperature of a vibrator XTAL (AT vibrator or the like). The processing unit 50 performs a temperature compensation process for making an oscillation frequency of the vibrator XTAL, having temperature characteristics as shown in FIG. 6, constant without depending on temperature.

Figure 7:
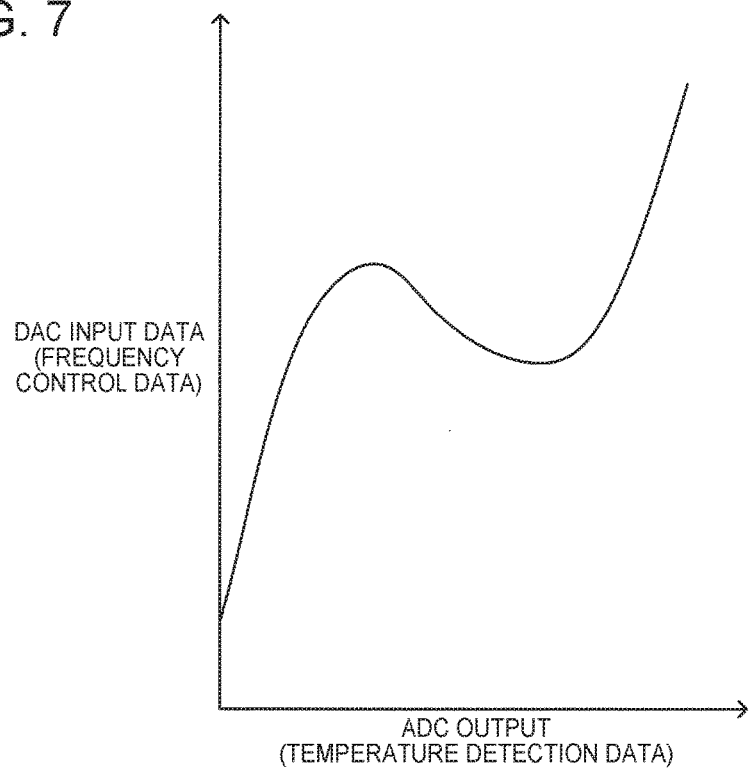
FIG. 7 is a diagram showing a temperature compensation process of this embodiment.

Specifically, the processing unit 50 performs a temperature compensation process in which output data (temperature detection data) of the A/D conversion unit 20 and input data (frequency control data) of the D/A conversion unit 80 have a correspondence relationship as shown in FIG. 7. The correspondence relationship (frequency correction table) of FIG. 7 can be acquired, for example, by a method in which an oscillator having a circuit device embedded therein is put into a thermostatic chamber, and input data (DDS) of the D/A conversion unit 80 and output data (DTD) of A/D conversion unit 20 at each temperature are monitored.

In addition, coefficient data of an approximation function for temperature compensation for realizing the correspondence relationship of FIG. 7 is stored in a memory unit (non-volatile memory) of the circuit device. The processing unit 50 performs an arithmetic operation process on the basis of the coefficient data which is read out from the memory unit and temperature detection data DTD received from the A/D conversion unit 20, thereby realizing a temperature compensation process for making an oscillation frequency of the vibrator XTAL constant without depending on temperature.

Meanwhile, a temperature detection voltage VTD of the temperature sensor unit 10 has, for example, negative temperature characteristics as described later. Therefore, it is possible to perform compensation by canceling temperature dependency of an oscillation frequency of the vibrator XTAL of FIG. 6 by the temperature compensation characteristics as shown in FIG. 7.

3. Method of this Embodiment

Next, details of a method of this embodiment will be described. First, a communication error of a global positioning system (GPS) which occurs due to frequency hopping will be described with reference to FIG. 8. Further, C/N characteristics of the oscillator 400 and spuriousness will be described with reference to FIGS. 16 to 19.

3.1 Frequency Hopping

Figure 8:
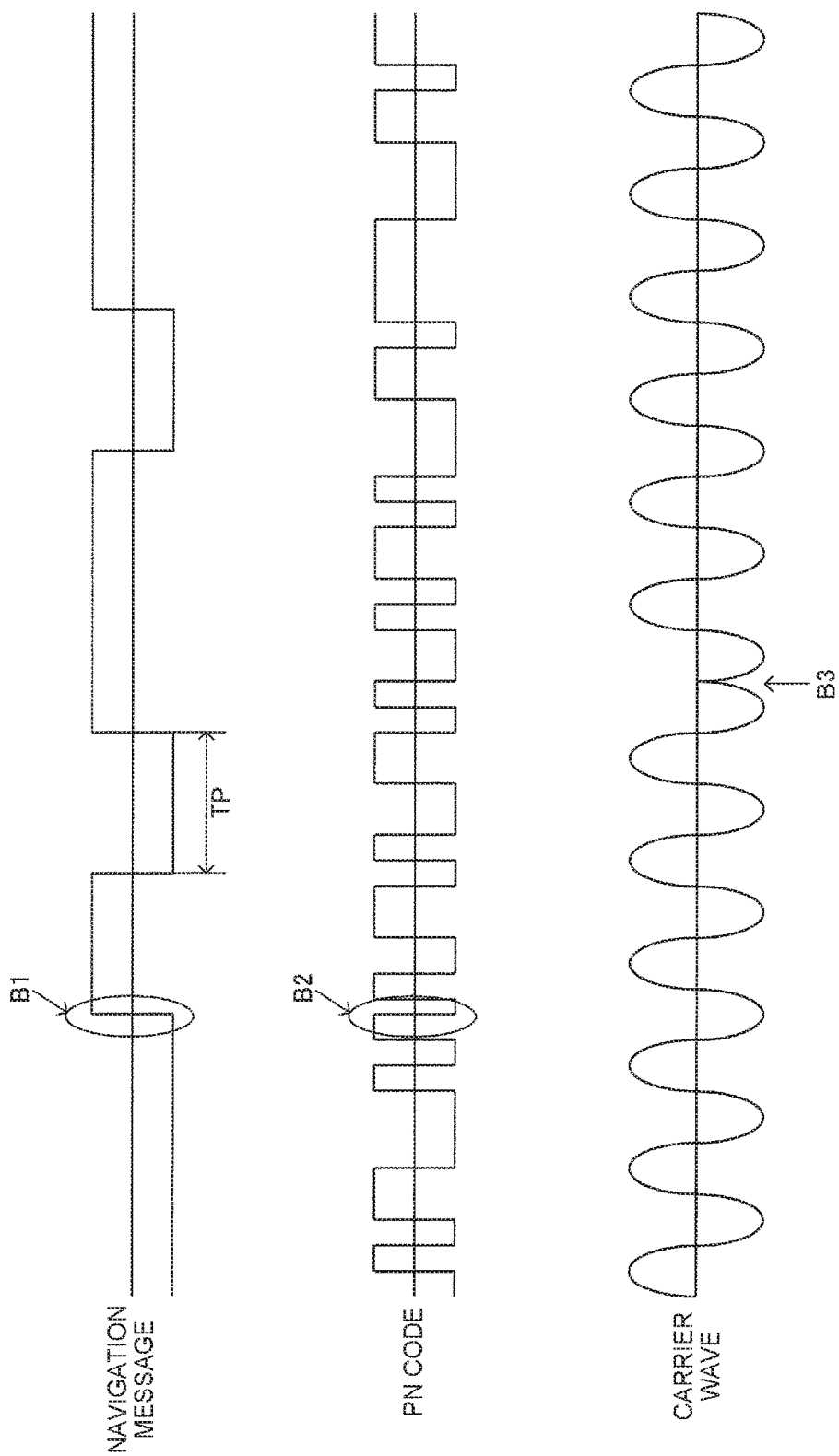
FIG. 8 is a diagram showing a communication error occurring due to a frequency drift.

A GPS satellite includes information regarding a satellite orbit, a time, and the like in a navigation message of FIG. 8 and transmits the message as a GPS satellite signal at a data rate of 50 bps. For this reason, the length of 1 bit is 20 msec (20 periods of a PN code). One navigation message is constituted by one master frame, and one master frame is constituted by 25 frames of 1500 bits.

The GPS satellite signal is modulated by a BPSK modulation method depending on the value of bits of the navigation message as shown in FIG. 8. Specifically, spread spectrum is performed by a PN code (pseudorandom code) being multiplied by the navigation message, and BPSK modulation is performed by a carrier wave (1575.42 MHz) being multiplied by a signal after the spread spectrum. In FIG. 8, a PN code of a portion B1 of the navigation message is shown, and a carrier wave of a portion B2 of the PN code is shown. Phase inversion of a carrier wave is performed as indicated by B3 at a timing when a logic level of the PN code changes. A period of one wavelength of a carrier wave is approximately 0.635 ns. A GPS receiver receives a carrier wave of the navigation message which is modulated by a BPSK modulation method, and performs a demodulation process of the received signal of the carrier wave, thereby acquiring a navigation message.

When a residual frequency from a frequency (1575.42 MHz) of a carrier wave is not made to fall within 4 Hz/20 msec during the demodulation process of the received signal, erroneous determination may occur in the demodulation process. That is, when a residual frequency from a frequency of a carrier wave is not made to fall within 4 Hz in TP=20 msec which is a period (cycle of a GPS navigation message) which has a length of one bit of the GPS navigation message, a communication error may occur due to frequency hopping.

Since a ratio of 4 Hz mentioned above to 1575.42 MHz which is a frequency of a carrier wave is approximately several ppb, FD which is the permissible frequency drift shown in FIGS. 2 and 3 is set to approximately several ppb.

For example, in the GPS receiver, a frequency of a carrier wave in a demodulation process is set in response to an oscillation signal generated by the circuit device (oscillator) of this embodiment. For this reason, it is necessary to make a frequency drift of an oscillation frequency of the oscillation signal fall within ±FD in TP=20 msec. In this manner, it is possible to prevent the occurrence of erroneous determination in a demodulation process of a received signal of a GPS satellite signal and to avoid the occurrence of a communication error (received error).

However, in a digital type oscillator of the related art such as a DTCXO, a frequency drift is not made to fall within ±FD (approximately several ppb) in a period TP (20 msec). For this reason, there is a problem in that a communication error, caused by frequency hopping as shown in FIG. 3, occurs due to erroneous determination of a demodulation process.

Consequently, in this embodiment, the problem of the frequency hopping is solved by adopting a method described in FIGS. 9 to 13 and the like.

Figure 9:
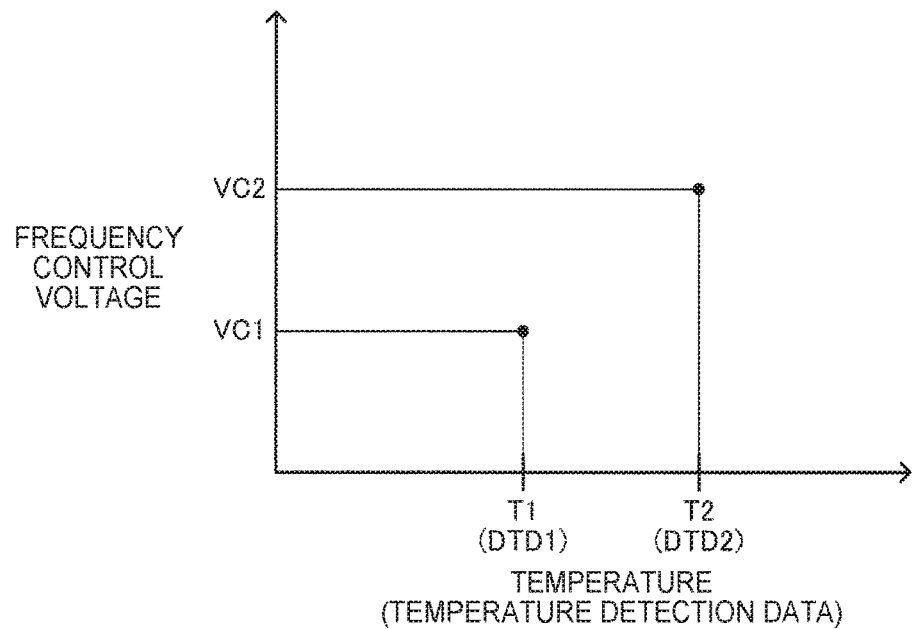
FIG. 9 is a diagram showing changes in a frequency control voltage in a case where temperature changes from first temperature to second temperature.

In FIG. 9, a frequency control voltage corresponding to a first temperature T1 is set to be a first control voltage VC1. In addition, a frequency control voltage corresponding to a second temperature T2 is set to be a second control voltage VC2. The frequency control voltage (oscillation control voltage) is a frequency control voltage of the oscillation circuit 150 of FIGS. 4 and 5 and corresponds to, for example, an output voltage VQ of the D/A conversion unit 80. The first and second temperatures T1 and T2 are temperatures detected by the temperature sensor unit 10, and correspond to temperature detection data DID received from the A/D conversion unit 20.

For example, temperature detection data DTD of the A/D conversion unit 20 in a case where temperature is the first temperature T1 is set to be first temperature detection data DTD1. Temperature detection data DTD of the A/D conversion unit 20 in a case where temperature is the second temperature T2 is set to be second temperature detection data DTD2.

In this case, the first control voltage VC1 of FIG. 9 is set to be a frequency control voltage corresponding to the first temperature detection data DTD1 in the temperature compensation characteristics described in FIG. 7. In addition, the second control voltage VC2 is set to be a frequency control voltage corresponding to the second temperature detection data DTD2 in the above-mentioned temperature compensation characteristics.

Meanwhile, in FIG. 9, a case where a frequency control voltage becomes higher as temperature becomes higher is assumed for the sake of convenience. That is, as it is apparent from FIGS. 6 and 7, there are a case of a temperature range in which a frequency control voltage becomes higher as temperature becomes higher and a case of a temperature range in which a frequency control voltage becomes lower as temperature becomes lower, but a description will be given by assuming the former case.

Figure 10:
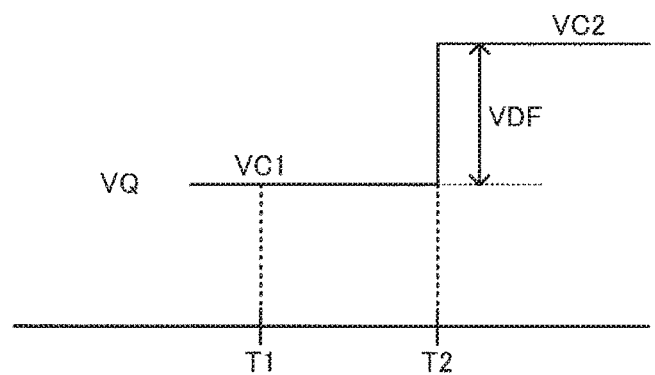
FIG. 10 is a diagram showing changes in a frequency control voltage in a case where temperature changes from first temperature to second temperature.

As shown in FIG. 10, in a case where temperature changes from a first temperature T1 to a second temperature T2, a differential voltage between a first control voltage VC1 and a second control voltage VC2 is VDF. Accordingly, an output voltage VQ of the D/A conversion unit 80 changes from VC1 to VC2 in a case where temperature changes from the first temperature T1 to the second temperature T2 when any device is not performed. That is, the output voltage VQ of the D/A conversion unit 80 changes with a step width of a differential voltage VDF.

That is, as described above, in the temperature compensation characteristics of FIG. 7, the first control voltage VC1 is a frequency control voltage corresponding to first temperature detection data DTD1, and the second control voltage VC2 is a frequency control voltage corresponding to second temperature detection data DTD2. Accordingly, in a normal case, the D/A conversion unit 80 outputs the first control voltage VC1 which is a frequency control voltage corresponding to the first temperature detection data DTD1 at the first temperature T1, and outputs the second control voltage VC2 which is a frequency control voltage corresponding to the second temperature detection data DTD2 at the second temperature T2. For this reason, an output voltage VQ of the D/A conversion unit 80 greatly changes from the first control voltage VC1 to the second control voltage VC2 with a step width of a differential voltage VDF.

In this manner, when the output voltage VQ of the D/A conversion unit 80 greatly changes with a step width of the differential voltage VDF, frequency hopping as shown in FIG. 3 occurs. That is, the oscillation circuit 150 of FIGS. 4 and 5 oscillates the vibrator XTAL with the output voltage VQ of the D/A conversion unit 80 as a frequency control voltage. Accordingly, when the output voltage VQ of the D/A conversion unit 80 changes with a step width of the differential voltage VDF, an oscillation frequency of the vibrator XTAL also changes with a step width corresponding to the differential voltage VDF. As a result, frequency hopping as shown in FIG. 3 occurs, which results in the occurrence of a communication error as described in FIG. 8.

Figure 11:
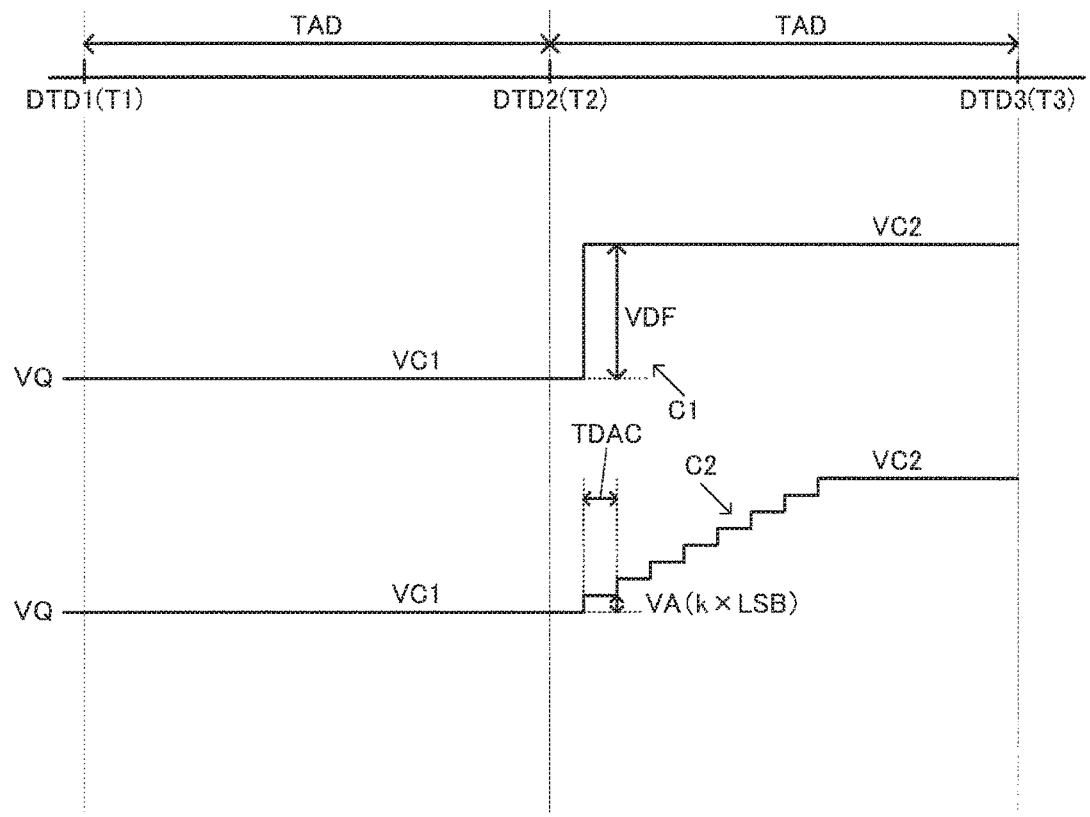
FIG. 11 is a diagram showing a method of this embodiment.

Consequently, in this embodiment, in a case where temperature changes from a first temperature T1 to a second temperature T2 as shown in FIG. 11, an output voltage VQ changing with a voltage width smaller than an absolute value of a differential voltage VDF between a first control voltage VC1 and a second control voltage VC2 is output from the D/A conversion unit 80 to the oscillation circuit 150.

The absolute value of the differential voltage VDF is, for example, |VC1-VC2|. In this case, the absolute value may be VC1>VC2 or may be VC1<VC2. In addition, in a case where the relation of VC1=VC2 (DTD1=DTD2) is established due to there being no change in temperature, a change voltage width of the output voltage VQ is of course set to 0 V, and thus the absolute value of the differential voltage VDF and the change voltage width of the output voltage VQ are consistent with each other. That is, this case is an exceptional case of a method of this embodiment.

For example, in a case where the method of this embodiment is not adopted, the output voltage VQ of the D/A conversion unit 80 changes with a step width of a differential voltage VDF as indicated by C1 of FIG. 11 when temperature changes from T1 to T2.

On the other hand, in the method of this embodiment, the output voltage VQ of the D/A conversion unit 80 changes with a voltage width VA smaller than an absolute value of the differential voltage VDF as indicated by C2 of FIG. 11. The voltage width VA is, for example, a voltage change in the output voltage VQ within a period TDAC.

As indicated by C2 of FIG. 11, when the output voltage VQ of the D/A conversion unit 80 is changed so as to satisfy the relation of VA<VDF, a change in an oscillation frequency of the oscillation circuit 150 becomes considerably smaller than in the case of C1. Accordingly, it is possible to suppress the occurrence of frequency hopping as shown in FIG. 3 and to prevent the occurrence of a communication error described in FIG. 8.

More specifically, in this embodiment, in a case where a minimum resolution of data in D/A conversion is set to LSB, the D/A conversion unit 80 outputs an output voltage VQ that changes with a step width of a voltage corresponding to k×LSB (k≥1). For example, as indicated by C2 of FIG. 11, the output voltage VQ of the D/A conversion unit 80 changes with a step width of a voltage corresponding to k×LSB in the form of a step (in a stepwise manner). That is, the above-mentioned voltage width VA is, for example, a step width of a voltage corresponding to k×LSB of the D/A conversion unit 80. Meanwhile, the voltage width VA is sufficient as long as the voltage width is equal to or less than a step width of a voltage corresponding to k×LSB, and may be set to be smaller than the step width of the voltage corresponding to k×LSB using, for example, a method of a modification example to be described later, or the like.

Here, LSB is a minimum resolution of data (frequency control data DDS which is output by the processing unit 50) which is input to the D/A conversion unit 80. A voltage corresponding to LSB is a minimum resolution voltage which is a voltage per minimum resolution of D/A conversion. Accordingly, a voltage corresponding to k×LSB is equivalent to a voltage of k times the minimum resolution voltage.

In addition, for example, in a case where a resolution of the D/A conversion unit 80 is set to i bits, the relation of k<$2^i$ is established, and k is an integer which is sufficiently smaller than $2^i$ (for example, k=1 to 8). More specifically, in a case where the resolution of the D/A conversion unit 80 is extended from n bits to i=n+m bits by providing the modulation circuit 90, the relation of k<$2^i$ can be established.

For example, when k=1, the output voltage VQ of the D/A conversion unit 80 changes with a step width of a voltage corresponding to 1 LSB (1 bit). For example, the output voltage VQ of the D/A conversion unit 80 changes (increases or decreases) with a step width of a voltage corresponding to 1 LSB in the form of a step (in a stepwise manner).

In other words, the output voltage VQ of the D/A conversion unit 80 changes with a step width of a voltage corresponding to 1 LSB (k×LSB in a broad sense) without depending on input data DDS to the D/A conversion unit 80. This can be realized, for example, by the processing unit 50 (output unit 70) of FIG. 5 outputting frequency control data DDS that changes from first data corresponding to first temperature to second data corresponding to second temperature in units of 1 LSB (units of k×LSB) in a case where temperature changes from the first temperature to the second temperature.

In addition, the stepwise change, as indicated by C2 of FIG. 11, with a step width of a voltage corresponding to k×LSB is realized by the processing unit 50 outputting frequency control data DDS (the D/A conversion unit 80 performing D/A conversion) at an output rate higher than an output rate of temperature detection data DTD (DTD1, DTD2) which is received from the A/D conversion unit 20.

For example, the A/D conversion unit 20 outputs temperature detection data DTD for each period of time TAD as shown in FIG. 11. For example, the A/D conversion unit 20 outputs the first temperature detection data DTD1 corresponding to a first temperature T1, and then outputs the second temperature detection data DTD2 corresponding to a second temperature T2 after the period TAD elapses. The period of time TAD is equivalent to an A/D conversion interval (sampling interval of a temperature detection voltage) of the A/D conversion unit 20, and 1/TAD is equivalent to an output rate of the A/D conversion unit 20.

Figure 21:
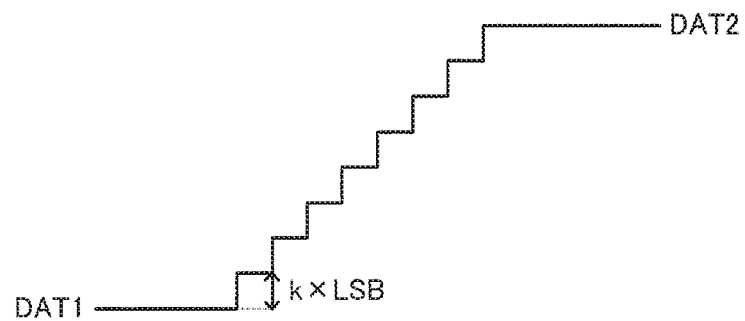
FIG. 21 is a diagram showing a method of changing frequency control data in units of k×LSB.
Figure 22:
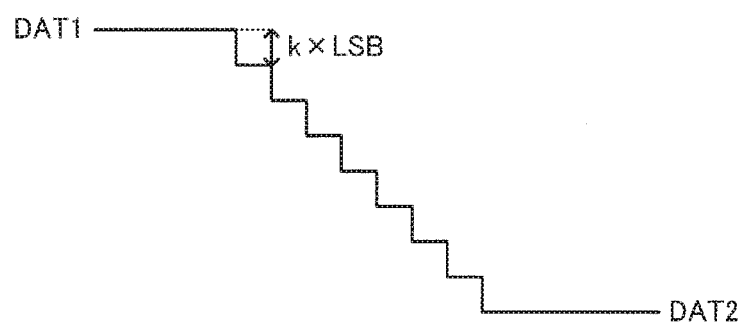
FIG. 22 is a diagram showing a method of changing frequency control data in units of k×LSB.

When the A/D conversion unit 20 outputs the second temperature detection data DTD2, the processing unit 50 having received the data performs digital signal processing such as a temperature compensation process and outputs frequency control data DDS corresponding to the second temperature detection data DTD2. At this time, the processing unit 50 changes the frequency control data DDS in units of k×LSB in a stepwise manner as shown in FIGS. 21 and 22 to be described later. Accordingly, an output voltage VQ of the D/A conversion unit 80 receiving the frequency control data DDS that changes in units of k×LSB and performing D/A conversion of the frequency control data also changes with a step width of a voltage corresponding to k×LSB for each period TDAC as indicated by C2 of FIG. 11.

Here, the period TDAC is equivalent to a D/A conversion interval (an output interval of frequency control data DDS of the processing unit 50) of the D/A conversion unit 80, and 1/TDAC is equivalent to an output rate of the processing unit 50 or the D/A conversion unit 80.

As shown in FIG. 11, the relation of TAD>TDAC is established, and 1/TDAC which is an output rate of the processing unit 50 or the D/A conversion unit 80 is higher than 1/TAD which is an output rate of the A/D conversion unit 20. Accordingly, even when a change width of an output voltage VQ for each period TDAC (for each output rate 1/TDAC) is a small voltage width like a voltage with VA=k×LSB, the output voltage VQ may change from a control voltage VC1 to a control voltage VC2 within the period of time TAD. That is, in a case where temperature detection data changes from DTD1 to DTD2 due to a change in temperature from T1 to T2, the output voltage VQ can be changed from the control voltage VC1 corresponding to the temperature detection data DTD1 to the control voltage VC2 corresponding to the temperature detection data DTD2 within the period of time TAD which is an A/D conversion interval. Since the voltage width VA of the voltage change in this case is small, it is also possible to suppress the occurrence of frequency hopping.

Figure 12:
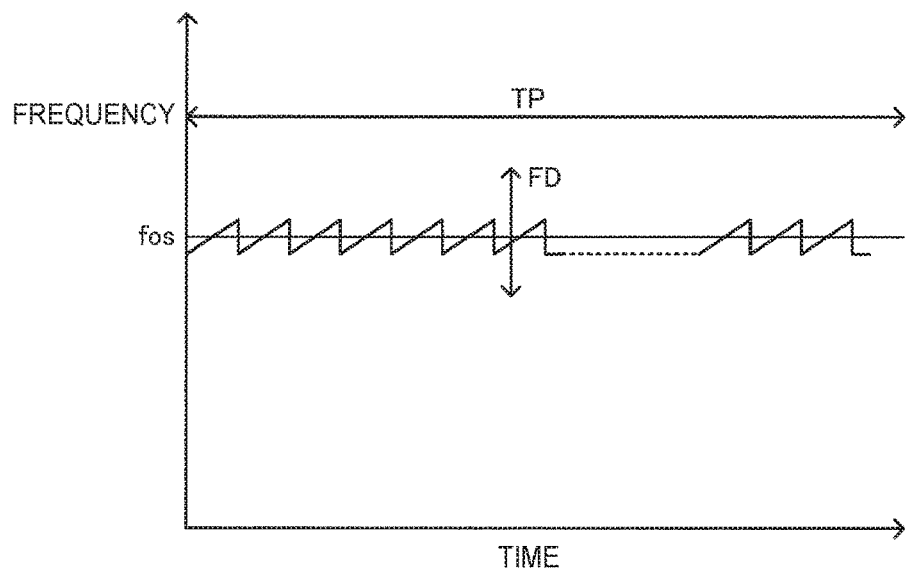
FIG. 12 is a diagram showing a method of this embodiment.
Figure 13:
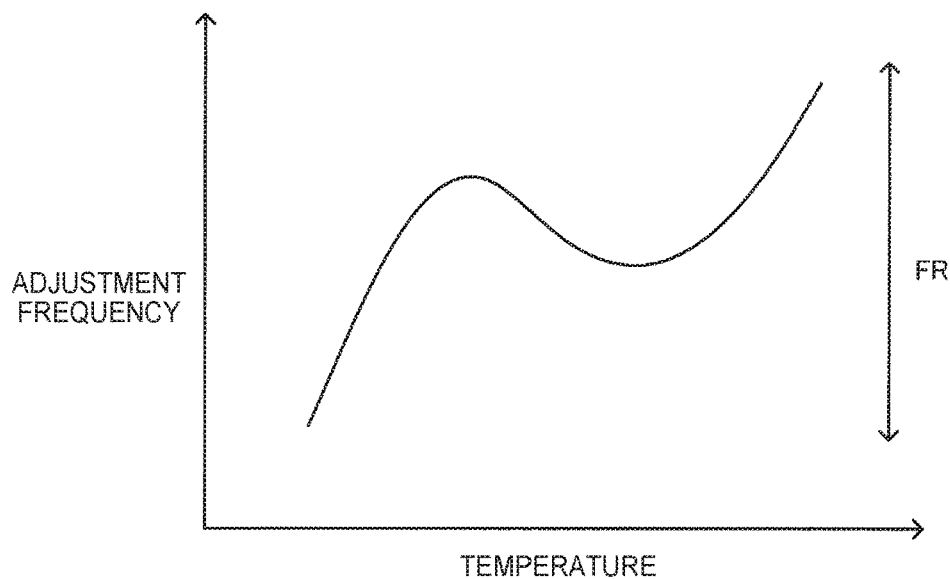
FIG. 13 is a diagram showing a method of this embodiment.

FIG. 12 is a diagram illustrating the method of this embodiment in a frequency region. For example, a frequency variable range of an oscillation frequency according to the oscillation signal generation circuit 140 (D/A conversion unit 80 and oscillation circuit 150) is set to be FR. For example, the oscillation signal generation circuit 140 performs frequency adjustment as shown in FIG. 13 with respect to a temperature change, but a frequency variable range according to the frequency adjustment is FR. That is, when a temperature change falls within the frequency variable range FR, it is possible to perform frequency adjustment by the oscillation signal generation circuit 140.

In addition, a permissible frequency drift of an oscillation frequency within a predetermined period TP is set to FD. For example, in order to prevent the occurrence of the communication error described in FIG. 8, it is necessary to make a frequency drift of an oscillation frequency within the predetermined period TP fall within a permissible frequency drift FD. When the frequency drift of the oscillation frequency does not fall within the permissible frequency drift FD due to frequency hopping as shown in FIG. 3, erroneous determination occurs in a demodulation process of a received signal such as a GPS satellite signal, which leads to a communication error.

In addition, a full-scale voltage of the D/A conversion unit 80 is set to be VFS. The D/A conversion unit 80 can change an output voltage VQ in a range of the full-scale voltage VFS. The full-scale voltage VFS is equivalent to, for example, a voltage range in a case where frequency control data DDS which is input to the D/A conversion unit 80 changes in a full range such as 0 to $2^i$.

A voltage width of a voltage change of an output voltage VQ at the D/A conversion interval (TDAC) of the D/A conversion unit 80 which is described in FIG. 11 is set to be VA. In this case, in the method of this embodiment, the following expression (1) is established as shown in FIG. 12.

$$VA<(FD/FR)\times VFS \quad (1)$$

Specifically, in a case where the resolution of the D/A conversion unit 80 is set to i bits, the following expression (2) is established.

$$1/2^i<(FD/FR) \quad (2)$$

The method of this embodiment which is shown in the above-mentioned expressions (1) and (2) is adopted, and thus a frequency drift of an oscillation frequency with respect to a nominal oscillation frequency fos (for example, approximately 16 MHz) in a predetermined period TP (for example, 20 msec) can be made to fall within a permissible frequency drift FD (for example, approximately several ppb) as shown in FIG. 12. Thereby, it is possible to suppress the occurrence of a communication error which is caused by the frequency hopping described in FIG. 3 and the like.

For example, (FD/FR)×VFS which is the right side of the above-mentioned expression (1) is obtained by multiplying (FD/FR), which is a ratio of a permissible frequency drift FD to a frequency variable range FR, by a full-scale voltage VFS of the D/A conversion unit 80.

When a voltage width VA of a change in an output voltage VQ at a D/A conversion interval (TDAC) of the D/A conversion unit 80 is set to be smaller than (FD/FR)×VFS, a frequency drift with respect to a nominal oscillation frequency fos can be made to fall within a permissible frequency drift FD in a frequency region as shown in FIG. 12. That is, the voltage width VA of a change in the output voltage VQ of the D/A conversion unit 80 can be made to be small as indicated by C2 of FIG. 11, and thus it is possible to suppress the occurrence of frequency hopping.

Figure 14:
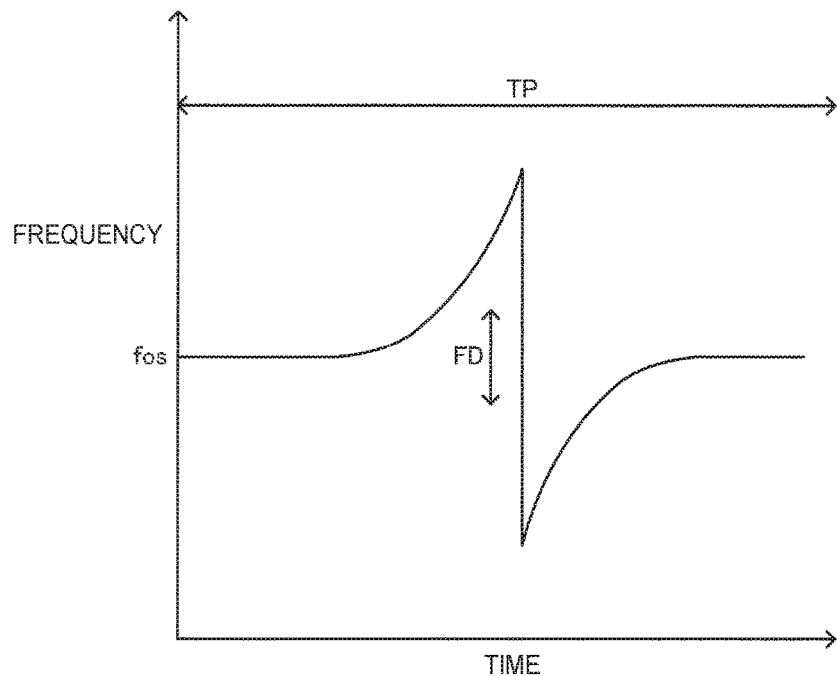
FIG. 14 is a diagram showing frequency hopping.

For example, when the above-mentioned expression (1) is not established, frequency hopping occurs in which a frequency drift with respect to a nominal oscillation frequency fos does not fall within a permissible frequency drift FD as shown in FIG. 14, and thus the communication error described in FIG. 8 and the like occur. In this embodiment, an output voltage VQ of the D/A conversion unit 80 is changed so that the above-mentioned expression (1) is established, and thus it is possible to suppress the occurrence of such frequency hopping and to prevent a communication error and the like.

That is, the D/A conversion unit 80 changes the output voltage VQ in a range of a full-scale voltage VFS to adjust an oscillation frequency of the oscillation circuit 150 in a frequency variable range FR as shown in FIG. 13, thereby realizing the temperature compensation process of an oscillation frequency described in FIGS. 6 and 7.

However, when, for example, the relation of VA≥(FD/FR)×VFS is established due to an increase in the voltage width VA of a change in the output voltage VQ of the D/A conversion unit 80, a frequency drift of an oscillation frequency exceeds a permissible frequency drift FD, which leads to the occurrence of frequency hopping as shown in FIG. 14.

On the other hand, in this embodiment, an output voltage VQ of the D/A conversion unit 80 is changed with a small voltage width VA in which the relation of VA<(FD/FR)×VFS is established, and thus it is possible to suppress the occurrence of the frequency hopping as shown in FIG. 14.

When the resolution of the D/A conversion unit 80 is set to i bits, the relation of $1/2^i<(FD/FR)$ is established in this embodiment as in the above-mentioned expression (2).

For example, when a full-scale voltage VFS of the D/A conversion unit 80 is multiplied by both sides of the above-mentioned expression (2), the following expression (3) is obtained.

$$\text{VFS} \times 1/2^i < (\text{FD/FR}) \times \text{VFS} \tag{3}$$

Here, $\text{VFS} \times 1/2^i$ which is the left side of the above-mentioned expression (3) is equivalent to a voltage (minimum resolution voltage) of 1 LSB of the D/A conversion unit 80. The above-mentioned expressions (2) and (3) mean that $\text{VFS} \times 1/2^i$ equivalent to the voltage of 1 LSB is set to be smaller than $(\text{FD/FR}) \times \text{VFS}$. In this manner, when the relation of $\text{VFS} \times 1/2^i < (\text{FD/FR}) \times \text{VFS}$ is established, a frequency drift of an oscillation frequency does not exceed the permissible frequency drift FD in a case where an output voltage VQ of the D/A conversion unit 80 is changed with a step width of the voltage of 1 LSB as indicated by C2 of FIG. 11, and thus it is possible to suppress the occurrence of frequency hopping.

In other words, i bits which are the resolution of the D/A conversion unit 80 are set so that the above-mentioned expressions (2) and (3) are established.

In this case, in order to secure a sufficient margin in consideration of various variations such as a manufacturing variation, it is preferable to set the resolution of the D/A conversion unit 80 so that $1/2^i$ becomes sufficiently smaller than (FD/FR). Specifically, the resolution of the D/A conversion unit 80 is set to, for example, i=20 bits or greater.

In this manner, for example, even when a permissible frequency drift within a predetermined period TP is approximately several ppb as described in FIG. 8, the above-mentioned expressions (2) and (3) are established with a margin. Therefore, it is possible to effectively suppress the occurrence of a communication error caused by frequency hopping.

Figure 15:
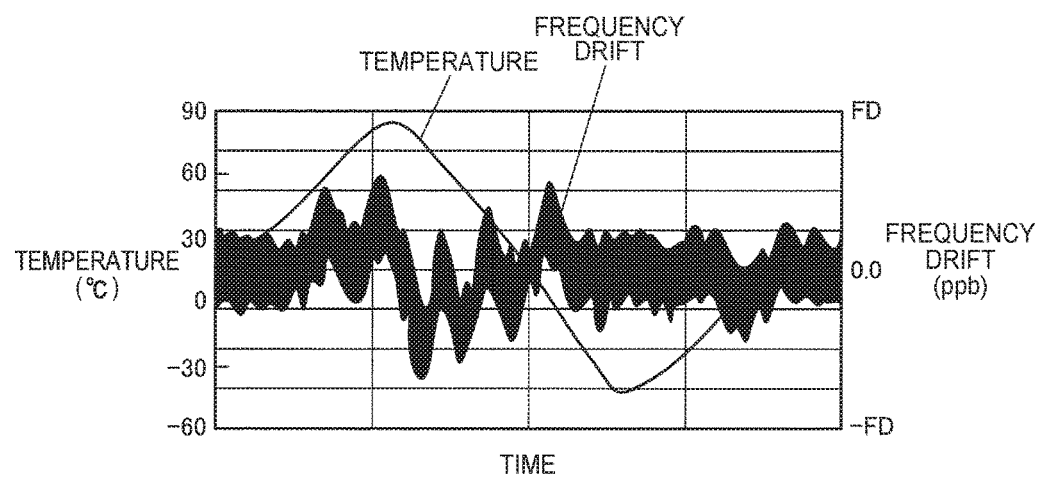
FIG. 15 is a diagram showing an improvement in a frequency drift in a case where a method of this embodiment is adopted.

For example, FIG. 15 is a diagram showing an improvement in a frequency drift in a case where the method of this embodiment which is described in FIGS. 11 to 13 is adopted. As it is apparent from comparison between FIG. 2, FIG. 3, and FIG. 15, according to the method of this embodiment, even when a circuit configuration such as a DTCXO is used, the frequency drift thereof can be suppressed to the same degree as that of the ATCXO of FIG. 2.

That is, in a circuit device of the related art such as a DTCXO, a frequency drift as shown in FIG. 3 occurs, which results in a communication error and the like.

On the other hand, when the method of this embodiment is adopted, a frequency drift can be set to the same degree as that of the ATCXO of FIG. 2, as shown in FIG. 15. Accordingly, a peculiar effect is exhibited which is capable of preventing the occurrence of a communication error and the like by suppressing frequency hopping while realizing a reduction in a chip size of a circuit device and an improvement in frequency accuracy by adopting a circuit configuration such as a DTCXO.

3.2 Spuriousness and C/N Characteristics of Oscillator

Spuriousness occurs due to a fluctuation in frequency control data DDS (a change in bits in the D/A conversion unit 80 in a narrow sense). First, characteristics of the spuriousness will be described. A main signal amplitude voltage of the oscillator 400 is set to Vo, and a main signal frequency (oscillation frequency) of the oscillator 400 is set to f0. With respect to Vo and f0, phase noise (spuriousness) in a case where a phase fluctuation occurs due to a slight fluctuation in a minimum bit in the D/A conversion unit 80 satisfies the following expressions (4) to (10).

Each of the expression will be specifically described. In a case where a frequency of a phase fluctuation is set to be fs, fs is equivalent to an output frequency of frequency control data DDS. Here, as shown in FIG. 4, in a case where the oscillation signal generation circuit 140 includes the D/A conversion unit 80 and the oscillation circuit 150, fs which is the output frequency of the frequency control data DDS denotes a sampling frequency (1/TDAC) of the D/A conversion unit 80, and $\Delta f$ which is a change in oscillation frequency denotes the amount of change in oscillation frequency due to one D/A conversion.

Since a minimum frequency resolution is set to $\Delta f$, $\phi s$ fluctuates with a frequency change 0, $+\Delta f$, or $-\Delta f$ for every sampling frequency fs in a case where a phase fluctuation amplitude of a phase fluctuation is set to be $\phi s$. Since it is considered that a frequency fluctuates with an amplitude $\pm \Delta f$, $\phi s$ is expressed by the following expression (4).

$$\phi s = 2\pi(\Delta f)t/2\pi(\text{fs})t = \Delta f/\text{fs} \tag{4}$$

A signal obtained by applying a phase fluctuation to a main signal can be expressed by the following expression (5) using these variables.

$$\text{Vo}(t) = \text{Vo} \cdot \sin\{2\pi(f0)t + \phi s \cdot \sin(2\pi(\text{fs})t)\} \tag{5}$$

The above-mentioned expression (5) can be modified like the following expression (6) by a product-sum formula of a trigonometrical function.

$$\text{Vo}(t) = \text{Vo}\{\sin(2\pi(f0)t) \cdot \cos(\phi s \cdot \sin(2\pi(\text{fs})t)) + \cos(2\pi(f0)t) \cdot \sin(\phi s \cdot \sin(2\pi(\text{fs})t))\} \tag{6}$$

In addition, the above-mentioned expression (6) can be modified like the following expression (7) by simplification performed on the assumption that $\phi s$ is sufficiently smaller than 1 in the above-mentioned expression (6).

$$\text{Vo}(t) = \text{Vo}\{\sin(2\pi(f0)t) + \phi s \cdot \cos(2\pi(f0)t) \cdot \sin(2\pi(\text{fs})t)\} \tag{7}$$

Further, the above-mentioned expression (7) can be modified like the following expression (8) by a product-sum formula of a trigonometrical function.

$$Vo(t) = Vo \cdot \sin(2\pi(f0)t) + \frac{Vo \cdot \phi s}{2}\sin(2\pi(f0+fs)t) - \frac{Vo \cdot \phi s}{2}\sin(2\pi(f0-fs)t) \tag{8}$$

As it is known from the above-mentioned expression (8), a signal component is observed as a sum of a first term of a main signal, and a second term and a third term, which are located vertically symmetrically with respect to each other, of a main signal frequency in a side band of a phase fluctuation component. A power ratio P_ratio(fs) between the main signal and the side band is obtained by the following expression (9) on the basis of amplitude levels thereof. In addition, when an intensity L (fs) with respect to a main signal of spuriousness is expressed with dBc/Hz as a unit, the following expression (10) is obtained.

$$\text{P\_ratio}\,(fs) = \frac{\left(\frac{Vo \cdot \phi s}{2}\right)^2}{Vo^2} = \frac{\phi s^2}{4} = \frac{1}{4}\left(\frac{\Delta f}{fs}\right)^2 \tag{9}$$

$$L(fs) = 10 \cdot \log(\text{P\_ratio}\,(fs)) = 10 \cdot \log\left(\frac{1}{4}\left(\frac{\Delta f}{fs}\right)^2\right) \tag{10}$$

D1 of FIG. 16 is a graph showing general C/N characteristics (characteristics of phase noise) of the oscillator 400.

The horizontal axis of FIG. 16 represents a detuning frequency with respect to a fundamental wave (oscillation frequency) which is expressed by a logarithm, and the vertical axis represents a signal intensity. As it is known from D1, the generation of phase noise is inevitable in the oscillator 400, and a design is performed on the assumption that the phase noise is generated. In other words, even when spuriousness having an intensity shown in the above-mentioned expression (10) occurs, the influence of the spuriousness in a circuit device 500 is sufficiently small when the intensity is lower than that of the original phase noise of the oscillator, and thus it is possible to suppress a deterioration in the accuracy of data to be acquired. On the contrary, as indicated by D2 and D3 of FIG. 16, in a case where the intensity of the spuriousness is excessively higher than that of the original phase noise of the oscillator, C/N characteristics of the oscillator 400 are degraded due to the spuriousness, which results in a deterioration in the accuracy of data to be acquired. For example, a deterioration in the accuracy of positional information obtained from a GPS received signal, and the like are incurred.

In the circuit device 500 of this embodiment, a fluctuation in frequency control data DDS is set to be equal to or less than k×LSB in order to suppress a defect caused by a frequency drift as described above. For this reason, it is expected that the value of Δf becomes smaller to a certain extent, but it is not ensured that a deterioration in C/N characteristics due to spuriousness can be suppressed under the condition. In other words, it is necessary to specify a relationship between Δf and fs so that a fluctuation in frequency control data DDS is set to be equal to or less than k×LSB and spuriousness has such an intensity as to be drowned by the original phase noise of the oscillator.

Figure 17:
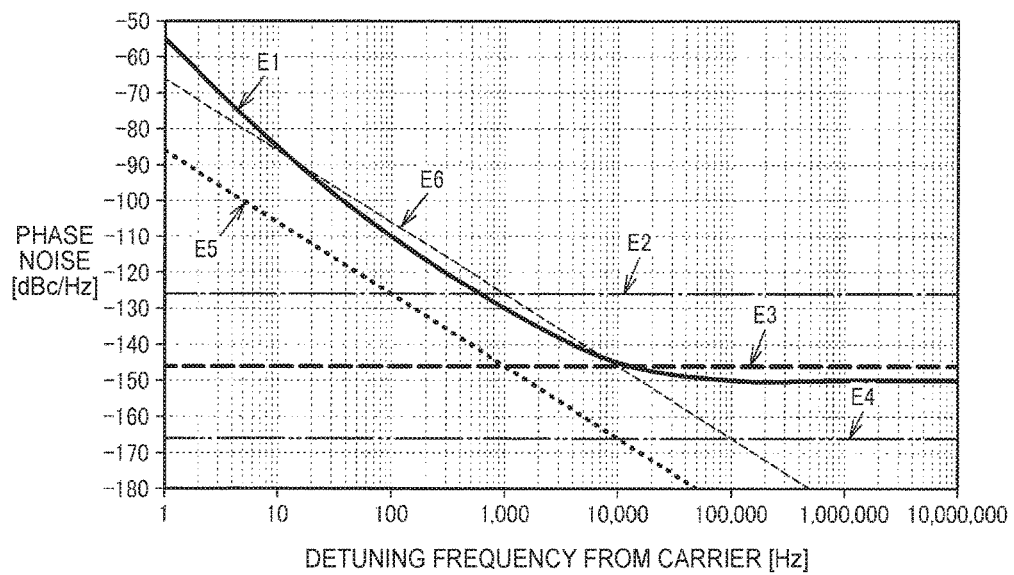
FIG. 17 is a diagram showing an example of characteristics of spuriousness based on Δf and fs.

A specific relationship example will be described with reference to FIG. 17. E1 of FIG. 17 is the same as D1 of FIG. 16, and denotes general C/N characteristics of a quartz crystal vibrator. E1 represents, for example, C/N characteristics of an AT cut quartz crystal vibrator, and corresponds to a case where a Q value has the worst characteristic in a request range (worst C/N characteristic). In other words, since the real circuit device 500 is designed so as to have no problem even when phase noise having an intensity indicated by E1 is generated, and thus it is possible to suppress a deterioration in data accuracy as long as spuriousness can be set to have such an intensity as to be drowned by E1.

E2 of FIG. 17 denotes an intensity of spuriousness in a case of Δf/fs=1/10$^6$, E3 denotes an intensity of spuriousness in a case of Δf/fs=1/10$^7$, and E4 denotes an intensity of spuriousness in a case of Δf/fs=1/10$^8$. As shown in the above-mentioned expression (10), an intensity of spuriousness is determined depending on Δf/fs. Accordingly, in a case where Δf/fs has a predetermined value, the intensity of spuriousness has a fixed value regardless of a detuning frequency, and is indicated by a straight line parallel to the horizontal axis like E2 to E4. Meanwhile, since a detuning frequency of spuriousness is fs, it may be considered that the horizontal axis represents an output frequency fs of frequency control data DDS with respect to E2 to E4. The same is true of E5 and E6 to be described later.

Here, when the relation of Δf/fs<1/10$^8$ can be established, an intensity of spuriousness becomes lower than that of a straight line indicated by E4, and thus it is possible to make the intensity lower than that of the original phase noise of the oscillator which is indicated by E1. In other words, the circuit device 500 of this embodiment may be configured such that the relation of Δf/fs<1/10$^8$ is satisfied. However, in order to make Δf/fs have a small value, fs has to be increased, or Δf has to be reduced. When fs is increased, power consumption in the D/A conversion unit 80 is increased, and it is necessary to increase the resolution in the D/A conversion unit 80 in order to decrease Δf (to reduce a change width of a frequency corresponding to a change in 1 LSB). In other words, on the condition that Δf/fs is set to be less than a predetermined value, a trade-off relationship is established in which a conversion rate in the D/A conversion unit 80 has to be increased by increasing fs when a request for a resolution is suppressed by increasing Δf, and a high resolution has to be secured by decreasing Δf when a request for the D/A conversion unit 80 is suppressed by decreasing fs. For this reason, it is also considered that a condition in which the relation of Δf/fs<1/10$^8$ is satisfied is ideal but is not easy to realize.

Accordingly, in this embodiment, a condition which is looser than Δf/fs<1/10$^8$ may be used. For example, the D/A conversion unit 80 of this embodiment includes a filter circuit 120 (or a filter circuit 130 to be described later) at the rear stage of the D/A converter 100. An output voltage of the D/A converter 100 is smoothed by the filter circuit 120, and thus it is possible to reduce a fluctuation in an oscillation frequency. That is, it is possible to reduce a substantial Δf by the filter circuit 120.

For example, when a sampling frequency fs of the D/A converter 100 is set to be high and a shielding rate is set to approximately 1/100 by the filter circuit 120, the intensity of spuriousness can be improved to approximately 1/100 (equal to or less than −40 dB). In this case, even when the relation of Δf/fs=1/10$^6$ (E2) is established, the intensity of spuriousness after the improvement made by the filter circuit 120 is set to equal to or less than E1, thereby allowing the spuriousness to be drowned by the original phase noise of the oscillator. That is, it is possible to suppress a deterioration in accuracy due to the degradation of C/N characteristics even when a condition of Δf/fs<1/10$^6$ is used.

As described above, the circuit device 500 of this embodiment includes an A/D conversion unit 20 that performs A/D conversion of a temperature detection voltage applied from the temperature sensor unit 10 and outputs temperature detection data DTD, a processing unit 50 that performs a temperature compensation process of an oscillation frequency on the basis of temperature detection data DTD and outputs frequency control data DDS of an oscillation frequency, and an oscillation signal generation circuit 140 that generates an oscillation signal of an oscillation frequency which is set on the basis of frequency control data DDS, using frequency control data DDS received from the processing unit 50 and a vibrator XTAL. In order to suppress a defect caused by frequency hopping, and the like, the processing unit 50 outputs frequency control data DDS changing from first data corresponding to first temperature to second data corresponding to second temperature in units of k×LSB (k≥1) in a case where temperature changes from the first temperature to the second temperature.

Further, in this embodiment, in order to increase the accuracy of data acquired using an oscillation signal, the relation of Δf/fs<1/10$^6$ is satisfied in a case where a sampling frequency of the D/A conversion unit 80 is set to be fs and a change in an oscillation frequency due to one D/A conversion of the D/A conversion unit 80 is set to be Δf.

When a change in frequency control data DDS is in units of k×LSB, the magnitude of Δf is limited accordingly. For example, in a case where the circuit device 500 includes the D/A converter 100, a change width ΔVDAC of an output voltage of the D/A converter 100 has a value depending on a change width of the frequency control data DDS. Variable capacitance included in an oscillation circuit has a capacitance value changing depending on a voltage, and a change coefficient (C/V) thereof is determined. In addition, the oscillation circuit 150 has an oscillation frequency changing depending on a capacitance value of variable capacitance, and a change coefficient (f/C) thereof is also determined. In other words, in this example, the relation of Δf=ΔVDAC× (C/V)×(f/C) is established, and thus a change Δf in an oscillation frequency has a value depending on k×LSB which is a change width of frequency control data DDS.

In other words, Δf is limited to a value equal to or less than a predetermined value by satisfying a first condition in which a change in frequency control data DDS is in units of k×LSB. However, in this embodiment, a second condition is satisfied in which the relation of $\Delta f/fs < 1/10^6$ is established. In this manner, it is possible to suppress a defect due to frequency hopping and to suppress a deterioration in accuracy due to spuriousness.

Meanwhile, a specific value of Δf to which k×LSB of frequency control data DDS corresponds is determined depending on the value of k, the full scale of the D/A converter 100, characteristics of variable capacitance, characteristics of the oscillation circuit 150, and the like. In addition, a specific value of Δf for satisfying the relation of $\Delta f/fs < 1/10^6$ is determined depending on an output frequency fs of frequency control data DDS. For this reason, which of the first condition and the second condition is a strict condition varies depending on a situation, and in any case, setting for satisfying a more strict condition may be performed in this embodiment.

In addition, a condition of $\Delta f/fs < 1/10^6$ is obtained from the viewpoint of drowning spuriousness by the original phase noise of the oscillator even when a detuning frequency (an output frequency fs of frequency control data DDS) has any value. However, as it is apparent from E1 of FIG. 17, the original phase noise of the oscillator becomes larger as a frequency becomes lower in a frequency band which is greatly influenced by 1/f noise. In other words, in a band having a relatively low detuning frequency, even when spuriousness having a higher intensity occurs, the spuriousness is drowned by phase noise of the oscillator 400, and thus a little influence is exerted on accuracy.

In other words, a condition of satisfying the relation of $\Delta f/fs < 1/10^6$ regardless of a detuning frequency (fs) of spuriousness is a sufficient condition from the viewpoint of suppressing a deterioration in the accuracy of data based on an oscillation signal, but there is also the possibility that the condition is an excessively strict condition.

Accordingly, in this embodiment, a condition different from $\Delta f/fs < 1/10^6$ may be used. E5 and E6 of FIG. 17 are plots showing characteristics of spuriousness in a case where Δf is set to a predetermined fixed value. As shown in FIG. 17, in a case where a unit of the vertical axis is set to dBc/Hz and the horizontal axis is set to be a logarithm of a detuning frequency, a spuriousness intensity in a case where Δf is set to a fixed value is expressed as a straight line that monotonously decreases. A segment of the straight line changes in accordance with the change of Δf, and spuriousness intensities in the same detuning frequency become higher as Δf becomes larger. E5 of FIG. 17 denotes characteristics of spuriousness in a case of Δf=0.1 mHz, and E6 denotes characteristics of spuriousness in a case of Δf=1 mHz.

As it is known from FIG. 17, E5 showing Δf=0.1 mHz is positioned below E1 showing C/N characteristics of the oscillator 400 regardless of the position thereof in the horizontal axis. In other words, it is possible to make an intensity of spuriousness smaller than the original phase noise of the oscillator by satisfying the relation of Δf<0.1 mHz. However, a condition of Δf<0.1 mHz is also an ideal condition similar to $\Delta f/fs = 1/10^8$, and has a little influence on accuracy even when the condition is actually a looser condition. Specifically, in this embodiment, the straight line indicated by E6 is set to be an upper limit, and may have a condition of Δf<1 mHz.

However, a condition of Δf<1 mHz is an excessively strict condition in a situation in which a detuning frequency (fs) is relatively large. As it is known from the above-mentioned expression (10), the intensity of spuriousness decreases as fs becomes larger. In other words, in a case where fs is large, it is possible to suppress an increase in the intensity of spuriousness even when Δf is large, and thus a little influence is exerted on accuracy. There is the possibility that the condition of Δf<1 mHz becomes a strict condition in which Δf is excessively decreased even when fs is large.

Accordingly, in this embodiment, switching between the relation of $\Delta f/fs < 1/10^6$ and the relation of Δf<1 mHz may be performed depending on a situation. Specifically, a condition may be switched with fs=1 kHz which is an intersection point between E2 and E6 of FIG. 17 as a boundary. On the right side of the intersection point, that is, in the case of fs≥1 kHz, E2 is positioned above E6, and thus a condition of E2 is looser. On the other hand, on the left side of the intersection point, that is, in the case of fs<1 kHz, E6 is positioned above E2, and thus a condition of E6 is looser. In other words, in this embodiment, a condition may be satisfied in which the relation of $\Delta f/fs < 1/10^6$ is established in the case of fs≥1 kHz and the relation of Δf<1 mHz is established in the case of fs<1 kHz. In this manner, a condition to be satisfied can be made loose, and thus it is possible to lower, for example, a request for the resolution of the D/A converter 100 and to facilitate the realization of the circuit device 500.

In addition, the method of this embodiment is not limited to a method using a combination of $\Delta f/fs < 1/10^6$ and Δf<1 mHz. Specifically, in a case where a sampling frequency of the D/A conversion unit 80 is set to be fs and a change in an oscillation frequency due to one D/A conversion of the D/A conversion unit 80 is set to be Δf, the relation of Δf<1 mHz may be established in the case of fs<1 kHz. At this time, it is also possible to adopt a condition different from $\Delta f/fs < 1/10^6$ in the case of fs≥1 kHz and to exclude fs≥1 kHz from an object to which the method of this embodiment is applied, from the start.

Meanwhile, various design methods are considered of a circuit device in which Δf and fs satisfy the above-mentioned condition. For example, a conversion rate (sampling frequency) which is required for the D/A conversion unit 80 varies depending on a circuit device. In a predetermined circuit device, a high sampling frequency such as fs=100 kHz can be set, but it is considered that only a low sampling frequency such as fs=100 Hz is permitted in a different circuit device from the viewpoint of power consumption and the like. In a circuit device in which the relation of fs=100 kHz is permitted, the relation of $\Delta f/fs < 1/10^6$ may be used as a condition as described above, and the relation of Δf<100 mHz is established. In this case, Δf can be made larger than in the relation of Δf<1 mHz, and thus there is no problem even when resolution is relatively rough. On the other hand, in a circuit device in which the relation of fs=100 Hz is established, the relation of Δf<1 mHz may be used as described above. In this case, a request for resolution becomes relatively large, but it is possible to realize a circuit device with low power consumption.

Here, the vibrator XTAL according to this embodiment is, for example, a quartz crystal vibrator. Meanwhile, it is known that the quartz crystal vibrator has characteristics, such as an oscillation frequency, which vary depending on a cutting azimuth from a crystal axis. The quartz crystal vibrator according to this embodiment may be an AT cut vibrator, a stress compensation-cut (SC cut) vibrator, or a SAW resonator which is widely used.

The AT cut vibrator has an angle with respect to a crystal axis being 35.15 degrees, and is a vibrator which is used for an SPXO, a TCXO, and a VCXO as an oscillation source of 10 MHz to 500 MHz. In addition, the SC cut vibrator is a vibrator which is used for an OCXO as an oscillation source of 10 MHz to 100 MHz from a feature of having temperature characteristics becoming minimum at high temperature. Meanwhile, in the AT cut vibrator and the SC cut vibrator, an oscillation frequency is determined by thickness slide. In addition, the SAW resonator is a vibrator to which a surface acoustic wave is applied, and vibrates depending on an electrode pattern of a quartz crystal surface. The SAW resonator is a vibrator having a high oscillation frequency of 100 MHz to 3.5 GHz and good C/N characteristics (high Q value).

Figure 18:
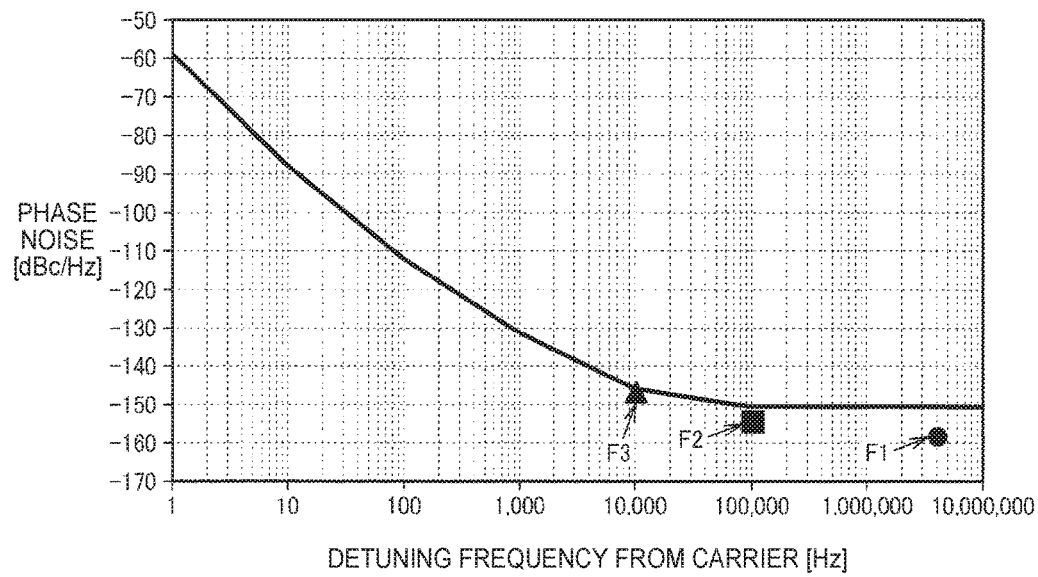
FIG. 18 is a diagram showing an example of setting of Δf and fs that do not degrade C/N characteristics.

Meanwhile, the relation of $\Delta f/fs < 1/10^6$ is a condition related to a ratio of $\Delta f$ to fs. For this reason, a large number of sets of $\Delta f$ and fs which satisfies the relation of $\Delta f/fs < 1/10^6$ are considered. FIG. 18 shows an example of a set of values of $\Delta f$ and fs in a case where data with good accuracy can be acquired without degrading C/N characteristics. F1 of FIG. 18 represents the relation of $(\Delta f, fs)=(0.1$ Hz, 4 MHz$)$, F2 represents the relation of $(\Delta f, fs)=(4$ mHz, 100 kHz$)$, and F3 represents the relation of $(\Delta f, fs)=(1$ mHz, 10 kHz$)$.

In this embodiment, the number of sets of values of $\Delta f$ and fs being limited to one is not obstructed. For example, only one of F1 to F3 is set as a set of values of $\Delta f$ and fs, and an operation is performed so as to satisfy a value which is necessarily set in the circuit device 500. However, the method of this embodiment is not limited thereto, and a set of values of $\Delta f$ and fs may be set to be variable. For example, three of F1 to F3 are held as candidates of a set of values of $\Delta f$ and fs, and any one of the three may be adopted depending on a situation.

For example, a set of values of $\Delta f$ and fs which is to be used is determined depending on whether of being within a predetermined period since the operation of the circuit device 500 is started. When the operation is started, a temperature compensation process is not performed on temperature detection data DTD up to that time, and thus a difference between an oscillation frequency of an oscillation signal SSC to be output and a desired oscillation frequency (hereinafter, referred to as a frequency error) may be large. It is possible to obtain frequency control data DDS for reducing a frequency error (setting a frequency error to zero in a narrow sense) by the temperature compensation process in the processing unit 50. However, in this embodiment, there is a limitation in that a fluctuation in an oscillation frequency per each time is restricted to $\Delta f$. In other words, a frequency error is decreased by only $\Delta f$ during one output of frequency control data DDS, and thus there is a concern that a long time is required until the frequency error is set to zero.

Consequently, in this embodiment, when an operation is started, $\Delta f$ is set to a relatively large value, and fs for satisfying the relation of $\Delta f/fs < 1/10^6$ may be set to a relatively large value. In cases of the examples of F1 to F3 mentioned above, the relation of $(\Delta f, fs)=(0.1$ Hz, 4 MHz$)$ indicated by F1 is used. In this manner, $\Delta f$ is relatively large, and thus it is possible to bring an oscillation frequency of an oscillation signal close to a desired frequency (to bring a frequency error close to zero) in a short period of time.

However, fs has to be increased in order to increase $\Delta f$, which results in an increase in power consumption, and the like. Accordingly, in a case where a time elapses to a certain degree (or in a case where a frequency error is reduced to a certain degree), it is preferable to decrease $\Delta f$ and fs. In a case of the example of FIG. 18, a set of values of $\Delta f$ and fs which is to be used is changed from F1 to $(\Delta f, fs)=(4$ mHz, 100 kHz$)$ indicated by F2. In addition, in a case where a time further elapses (in a case where a frequency error is reduced), a set of values of $\Delta f$ and fs which is to be used may be changed from F2 to $(\Delta f, fs)=(1$ mHz, 10 kHz$)$ indicated by F3.

Figure 19:
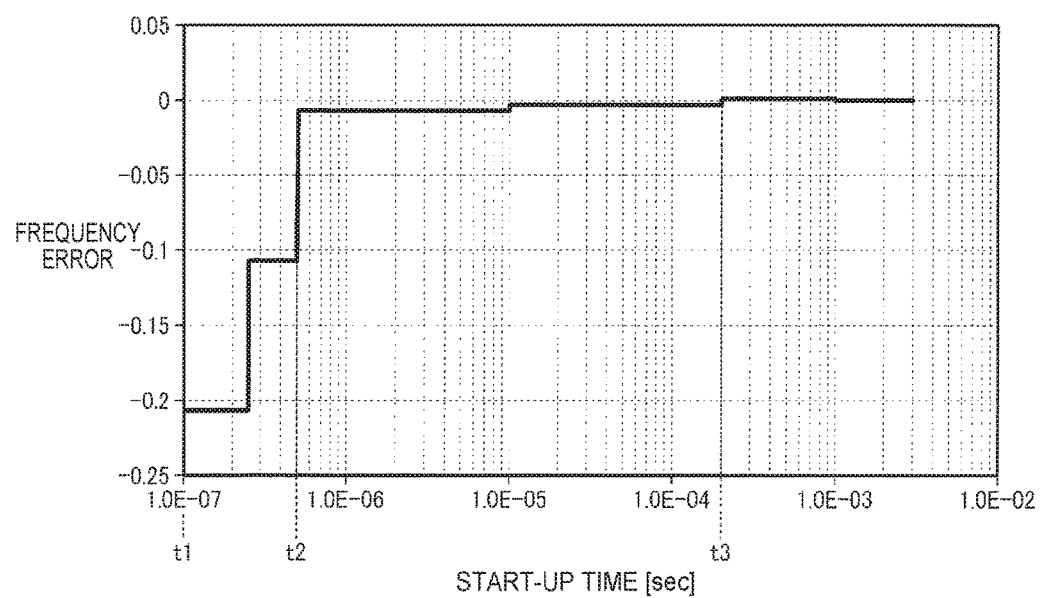
FIG. 19 is a diagram showing a method of changing setting of Δf and fs in time series.

FIG. 19 is a diagram showing the above-described control. The vertical axis in FIG. 19 represents a frequency error (Hz), and the horizontal axis represents an elapsed time since the start of an operation (start-up) which is expressed by a logarithm. As indicated by t1 to t2 of FIG. 19, an operation is performed based on a parameter indicated by F1 for a predetermined period of time since start-up. Since a sampling frequency fs is high and $\Delta f$ which is the amount of change in frequency per each time is large, a frequency error which is equal to or greater than 0.2 Hz during the start-up can be brought close to zero in a short period of time. In addition, the operation is performed based on parameters indicated by F2 for a period of time between t2 and t3, and the operation is performed based on parameters indicated by F3 for a period of time after t3.

In this manner, a condition of $\Delta f/fs < 1/10^6$ can be realized using parameters depending on a situation. Specifically, a target value is followed at high speed in a situation where there is the possibility of a frequency error being large, and fs is decreased to thereby suppress an increase in power consumption in a case where the following is completed to a certain degree.

Meanwhile, an example in which there are three sets of values of $\Delta f$ and fs has been described here, but it is needless to say that there are two sets or four or more sets of values of $\Delta f$ and fs. In addition, $\Delta f$ and fs may satisfy the relation of $\Delta f/fs < 1/10^6$, and the specific numerical values thereof are not limited to F1 to F3 of FIG. 18. In addition, a description has been given of an example in which $\Delta f$ and fs are set to be variable in a condition in which the relation of $\Delta f/fs < 1/10^6$ is satisfied, but k may be set to be variable in a condition in which frequency control data DDS is changed in units of k×LSB (k≥1).

4. Example of Detailed Configuration

4.1 Processing Unit

Figure 20:
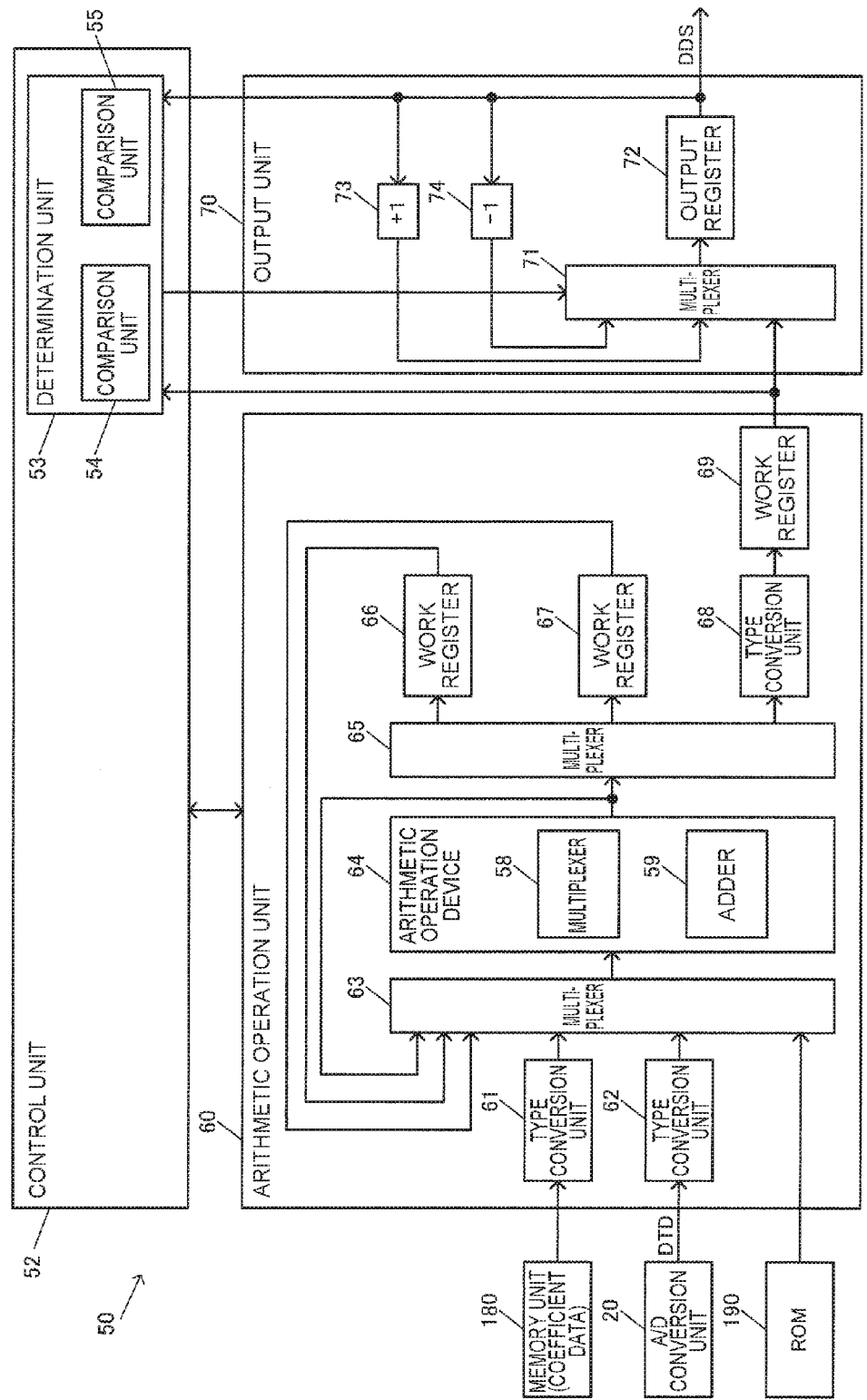
FIG. 20 shows an example of a detailed configuration of a processing unit.

Next, an example of a detailed configuration of each unit of the circuit device of this embodiment will be described. FIG. 20 is a diagram showing an example of a detailed configuration of the processing unit 50.

As shown in FIG. 20, the processing unit 50 (DSP unit) includes a control unit 52, an arithmetic operation unit 60, and an output unit 70. The control unit 52 performs the control of the arithmetic operation unit 60 and the output unit 70 and various determination processes. The arithmetic operation unit 60 performs an arithmetic operation of a temperature compensation process of an oscillation frequency on the basis of temperature detection data DTD received from the A/D conversion unit 20. The output unit 70 receives arithmetic operation result data from the arithmetic operation unit 60 and outputs frequency control data DDS.

The control unit 52 includes a determination unit 53. The determination unit 53 includes comparison units 54 and 55, and performs various determination processes on the basis of comparison results in the comparison units 54 and 55.

The arithmetic operation unit 60 includes type conversion units 61, 62, and 68, multiplexers 63 and 65, an arithmetic operation device 64, work registers 66, 67, and 69. The arithmetic operation device 64 includes a multiplier 58 and an adder 59.

The type conversion unit 61 receives coefficient data which is input from the memory unit 180 to thereby perform type conversion from a binary type (integer) into a floating-point type (single precision), and outputs coefficient data after the type conversion to the multiplexer 63. The type conversion unit 62 receives temperature detection data DTD which is input from the A/D conversion unit 20 to thereby perform type conversion from a binary type into a floating-point type, and outputs the temperature detection data DTD after the type conversion to the multiplexer 63. For example, type conversion for converting 15-bit binary temperature detection data DTD into a 32-bit floating point (an exponent part=8 bits, a mantissa part=23 bits, a code=1 bits). In addition, constant data, which is a fixed value for a temperature compensation process, is input to the multiplexer 63 from a ROM 190 that stores the constant data.

The multiplexer 63 selects any of output data of the arithmetic operation device 64, pieces of output data of the work registers 66 and 67, output data of the type conversion units 61 and 62, and output data of the ROM 190, and outputs the selected output data to the arithmetic operation device 64. The arithmetic operation device 64 performs an arithmetic operation process such as a product-sum arithmetic operation of a 32-bit floating point by the multiplier 58 and the adder 59 to thereby perform a temperature compensation process. The multiplexer 65 selects any of pieces of output data of the multiplier 58 and the adder 59 of the arithmetic operation device 64, and outputs the selected output data to any of the work registers 66 and 67 and the type conversion unit 68. The type conversion unit 68 performs type conversion of arithmetic operation result data of the arithmetic operation unit 60 (arithmetic operation device 64) from a floating-point type into a binary type. For example, type conversion for converting arithmetic operation result data of a 32-bit floating point into 20-bit binary arithmetic operation result data is performed. The arithmetic operation result data after the type conversion is held in the work register 69.

The arithmetic operation unit 60 (arithmetic operation device 64) performs a temperature compensation process of approximating a curve of temperature characteristics of FIG. 6 by, for example, a quintic approximation function (polynomial expression) as expressed by the following expression (11).

$$\text{Vcp}=b \cdot (T-T0)^5+c \cdot (T-T0)^4+d \cdot (T-T0)^3+e \cdot (T-T0) \tag{11}$$

In the above-mentioned expression (11), T is equivalent to a temperature indicated by temperature detection data DTD, and T0 is equivalent to a reference temperature (for example, 25° C.). Here, b, c, d, and e are coefficients of the approximation function, and pieces of data of the coefficients are stored in the memory unit 180. The arithmetic operation device 64 performs an arithmetic operation process such as a product-sum arithmetic operation of the above-mentioned expression (11).

The output unit 70 includes a multiplexer 71, an output register 72, an LSB adder 73, and an LSB subtracter 74. The multiplexer 71 selects any of arithmetic operation result data which is output data of the arithmetic operation unit 60, output data of the LSB adder 73, and output data of the LSB subtracter 74 and outputs the selected data to the output register 72. The determination unit 53 of the control unit 52 monitors output data of the work register 69 and output data of the output register 72. The determination unit performs various comparisons and determinations using the comparison units 54 and 55 and controls the multiplexer 71 on the basis of determination results.

In this embodiment, the output unit 70 outputs frequency control data DDS changing from first data DAT1 corresponding to first temperature to second data DAT2 corresponding to second temperature in units of k×LSB in a case where temperature changes from the first temperature to second temperature as shown in FIGS. 21 and 22. For example, k is 1, and frequency control data DDS changing in units of 1 LSB is output.

For example, the output register 72 stores the first data DAT1 which is arithmetic operation result data of the arithmetic operation unit 60 of the last time (n−1-th timing). The work register 69 stores the second data DAT2 which is arithmetic operation result data of the arithmetic operation unit 60 of this time (n-th timing).

In a case where the second data DAT2 which is arithmetic operation result data of this time is larger than the first data DAT1 which is arithmetic operation result of the last time as shown in FIG. 21, the output unit 70 outputs addition result data as frequency control data DDS while performing a process of adding 1 LSB (k×LSB in a broad sense) which is a predetermined value to the first data DAT1 until the addition result data reaches the second data DAT2.

On the other hand, in a case where the second data DAT2 which is arithmetic operation result data of this time is smaller than the first data DAT1 which is arithmetic operation result of the last time as shown in FIG. 22, the output unit 70 outputs subtraction result data as frequency control data DDS while performing a process of subtracting 1 LSB (k×LSB) which is a predetermined value from the first data DAT1 until the subtraction result data reaches the second data DAT2.

Specifically, the determination unit 53 of the control unit 52 compares the first data DAT1 stored in the output register 72 with the second data DAT2 stored in the work register 69. Determination of the comparison is performed by the comparison unit 54.

In a case where DAT2 is larger than DAT1 as shown in FIG. 21, a process of adding 1 LSB to DAT1 of the output register 72 is performed by the LSB adder 73, and output data of the LSB adder 73 is selected by the multiplexer 71. Thereby, addition result data which is obtained by sequentially adding 1 LSB to DAT1 is held in the output register 72 as shown in FIG. 21. The addition result data which is updated by 1 LSB being sequentially added is output as frequency control data DDS. The addition process is repeated until the addition result data reaches DAT2. A comparison process for determining consistency between the addition result data and DAT2 is performed by the comparison unit 55.

On the other hand, in a case where DAT2 is smaller than DAT1 as shown in FIG. 22, a process of subtracting 1 LSB from DAT1 of the output register 72 is performed by the LSB subtracter 74, and output data of the LSB subtracter 74 is selected by the multiplexer 71. Thereby, subtraction result data which is obtained by 1 LSB being sequentially subtracted from DAT1 is held in the output register 72 as shown in FIG. 22. The subtraction result data which is updated by 1 LSB being sequentially subtracted is output as frequency control data DDS. The subtraction process is repeated until the subtraction result data reaches DAT2.

Meanwhile, a maximum number of times of each of the addition process and the subtraction process that are performed by the LSB adder 73 and the LSB subtracter 74 is set to a predetermined number of times (for example, 8 times). For example, a maximum temperature change of an environment temperature can be specified (for example, 2.8° C./10 seconds). Accordingly, for example, a temperature change corresponding to 1 LSB×a predetermined number of times (for example, a temperature change corresponding to a voltage of 1 LSB×8 times) is set so as to sufficiently exceed the above-mentioned maximum temperature change.

In addition, as described in FIG. 11, an output rate (1/TDAC) of frequency control data DDS of the processing unit is higher than an output rate (1/TAD) of temperature detection data DTD of the A/D conversion unit 20. Accordingly, for example, in a period of time TAD between when the temperature detection data DTD2 is input to the processing unit 50 from the A/D conversion unit 20 in FIG. 11 to when the next temperature detection data DTD3 is input, a process of adding or subtracting 1 LSB as shown in FIGS. 21 and 22 can be performed a predetermined number of times. For example, an addition process or a subtraction process can be performed a predetermined number of times (for example, 8 times) which is the above-mentioned maximum number of times.

As described above, according to the processing unit 50 having a configuration shown in FIG. 20, it is possible to output, for example, frequency control data DDS changing from the first data DAT1 corresponding to first temperature (first temperature detection data DTD1) to the second data DAT2 corresponding to second temperature (second temperature detection data DTD2) in units of k×LSB as shown in FIGS. 21 and 22. Thereby, the method of this embodiment described in FIGS. 11 to 13 can be realized by the output control of frequency control data DDS of the processing unit 50.

In addition, in this embodiment, for example, the processing of the arithmetic operation unit 60 is realized by an arithmetic operation process with high accuracy such as 32 bits. Accordingly, for example, when the type conversion unit 68 performs type conversion of arithmetic operation result data of a 32-bit floating point, it is possible to acquire, for example, 20-bit binary frequency control data DDS (arithmetic operation result data) on the basis of a 23-bit mantissa part with accuracy maintained. Thereby, as described in FIG. 5, for example, frequency control data DDS of i=20 bits can be input to the D/A conversion unit 80 from the processing unit 50. The modulation circuit 90 modulates data of n=16 bits of the frequency control data DDS on the basis of data of m=4 bits in i=20 bits, and the D/A converter 100 performs D/A conversion of the modulated data of n=16 bits, thereby allowing D/A conversion with a resolution of i=20 bits to be realized.

4.2 D/A Conversion Unit

Figure 23:
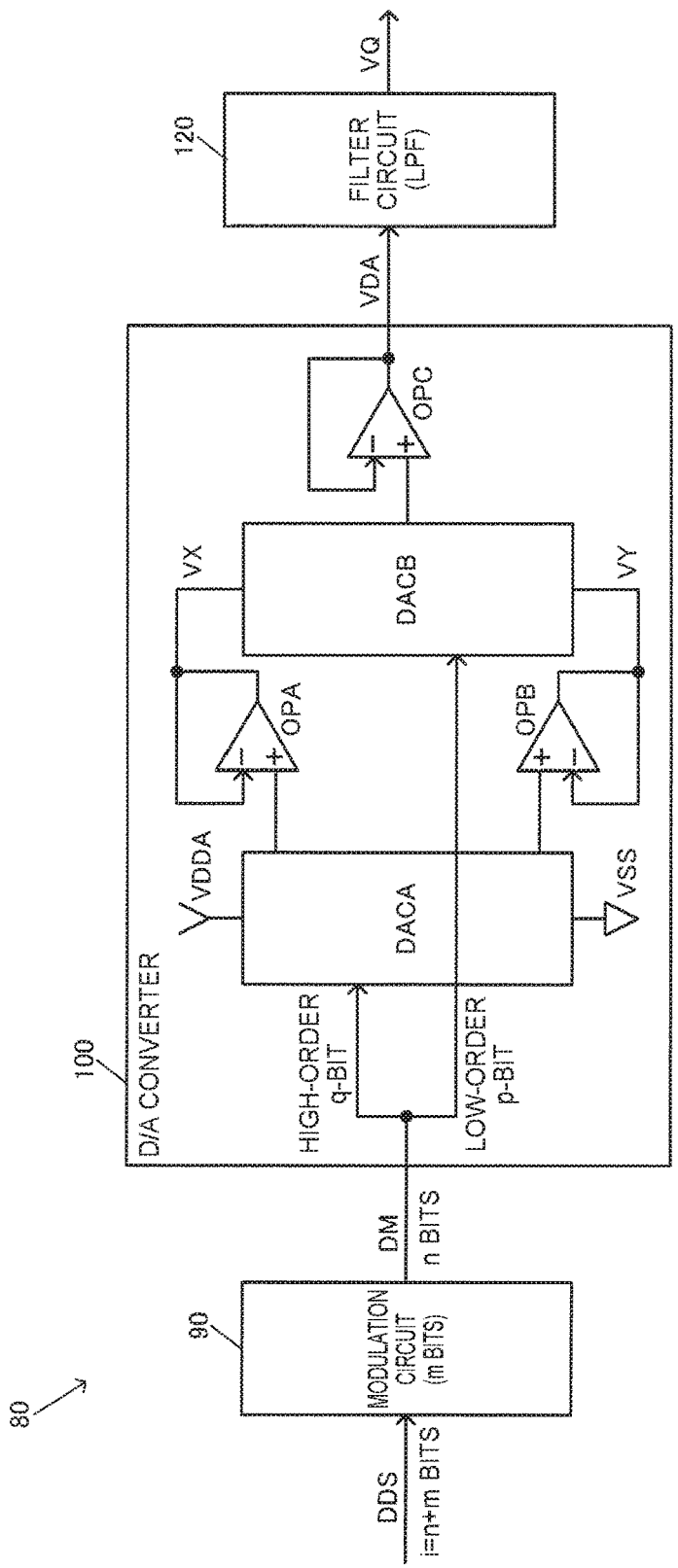
FIG. 23 shows an example of a detailed configuration of a D/A conversion unit.
Figure 24:
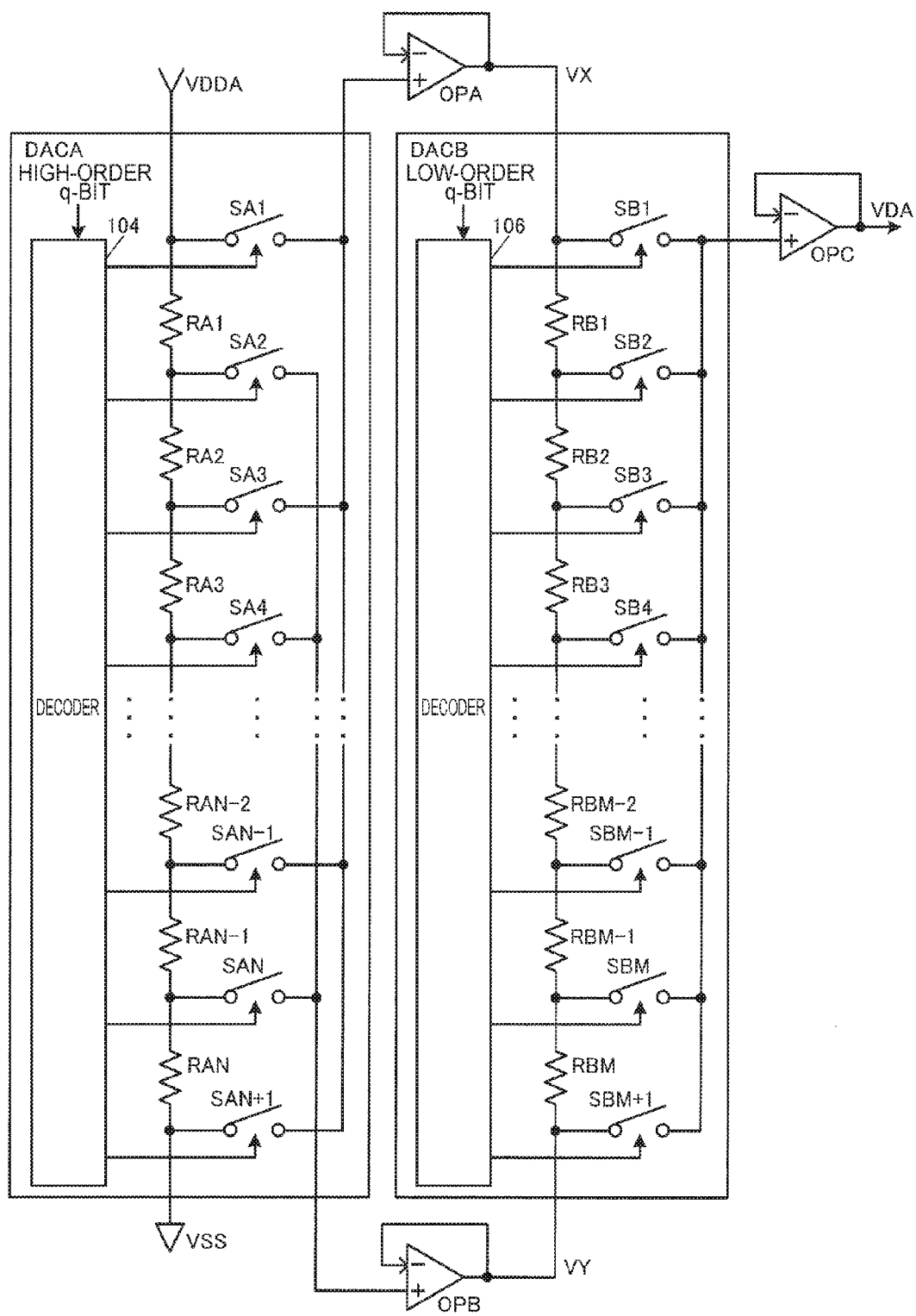
FIG. 24 shows an example of a further detailed configuration of the D/A conversion unit.

FIGS. 23 and 24 are diagrams showing an example of a detailed configuration of the D/A conversion unit 80. The D/A conversion unit 80 includes a modulation circuit 90, a D/A converter 100, and a filter circuit 120.

As shown in FIG. 23, the D/A converter 100 includes a D/A converter DACA located on an upper side, a D/A converter DACB located on a lower side, and voltage-follower-connected operational amplifiers (arithmetic operation amplifiers) OPA, OPB, and OPC.

High-order q-bit data in n-bit (n=q+p) data DM received from the modulation circuit 90 is input to the upper DACA, and low-order p-bit (for example, p=q=8) data is input to the lower DACB. The upper DACA and the lower DACB are resistor string type D/A converters that selects a voltage corresponding to input data, among a plurality of divided voltages obtained by voltage division performed by a plurality of resistors connected to each other in series.

As shown in FIG. 24, the upper DACA includes a plurality of resistors RA1 to RAN that are connected to each other in series between a node of a high-potential side power supply voltage VDDA and a node of a low-potential side power supply voltage VSS. In addition, the upper DACA includes a plurality of switch elements SA1 to SAN+1 each of which one end is connected to a voltage devision node of the resistors RA1 to RAN, and a decoder 104 (switch control circuit) that generates a switch control signal for turning on or turning off the switch elements SA1 to SAN+1 on the basis of the high-order q-bit data of the data DM.

The upper DACA outputs one divided voltage out of divided voltages at both ends of a resistor specified by the high-order q-bit data among the plurality of resistors RA1 to RAN to a non-inversion input terminal of the operational amplifier OPA, and outputs the other divided voltage to a non-inversion input terminal of the operational amplifier OPB. Thereby, the one voltage is subjected to impedance conversion by the voltage-follower-connected operational amplifier OPA, and is thus supplied to the lower DACB as a voltage VX. In addition, the other voltage is subjected to impedance conversion by the voltage-follower-connected operational amplifier OPB, and is thus supplied to the lower DACB as a voltage VY.

For example, in a case where the resistor RA1 is specified by the high-order q-bit data, a divided voltage on a high potential side out of divided voltages at both ends of the resistor RA1 is supplied as a voltage VX through the switch element SA1 and the operational amplifier OPA that are turned on. In addition, a divided voltage on a low potential side is supplied as a voltage VY through the switch element SA2 and the operational amplifier OPB that are turned on. In addition, in a case where the resistor RA2 is specified by the high-order q-bit data, a divided voltage on a low potential side out of divided voltages at both ends of the resistor RA2 is supplied as a voltage VX through the switch element SA3 and the operational amplifier OPA that are turned on. In addition, a divided voltage on a high potential side is supplied as a voltage VY through the switch element SA2 and the operational amplifier OPB that are turned on.

The lower DACB includes a plurality of resistors RB1 to RBM that are connected to each other in series between a node of a voltage VX and a node of a voltage VY. In addition, the lower DACB includes a plurality of switch elements SB1 to SBM+1 each of which one end is connected to a voltage devision node of the resistors RB1 to RBM, and a decoder 106 (switch control circuit) that generates a switch control signal for turning on or turning off the switch elements SB1 to SBM+1 on the basis of the low-order p-bit data of the data DM.

The lower DACB outputs one divided voltage selected by the low-order p-bit data, among a plurality of divided voltages of the resistors RB1 to RBM, to a non-inversion input terminal of the voltage-follower-connected operational amplifier OPC through a switch element which is turned on, as a selected voltage. Thereby, the selected voltage is output as an output voltage VDA of the D/A converter 100.

Figure 25:
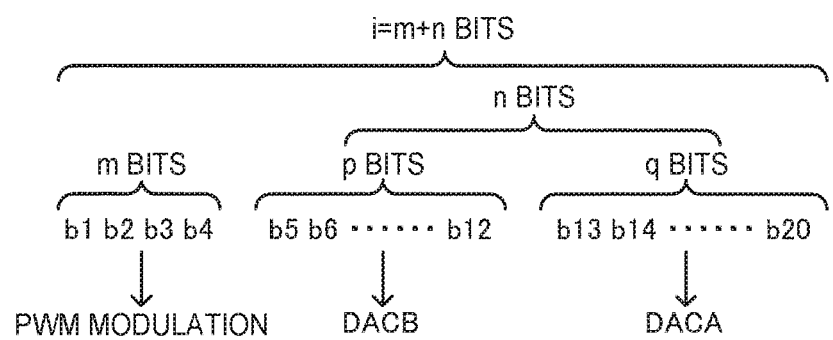
FIG. 25 is a diagram showing PWM modulation.
Figure 26:
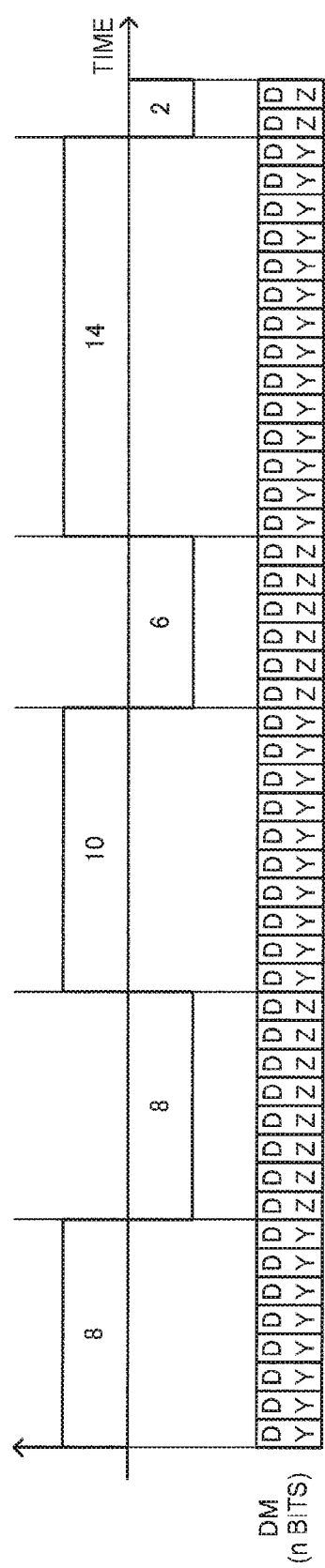
FIG. 26 is a diagram showing PWM modulation.
Figures 27, 28:
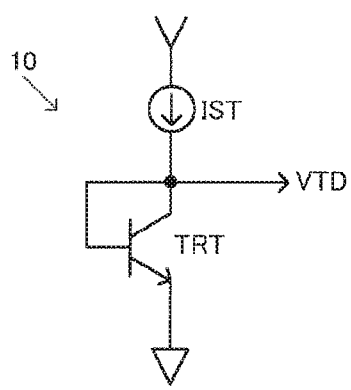
FIG. 27 is a diagram showing PWM modulation.
FIG. 28 shows an example of a detailed configuration of a temperature sensor unit.

FIGS. 25 to 27 are diagrams showing the modulation circuit 90. As shown in FIG. 25, the modulation circuit 90 receives frequency control data DDS of i=(n+m) bits from the processing unit 50. The modulation circuit performs PWM modulation of high-order n-bit (bits b5 to b20) data of the frequency control data DDS on the basis of low-order m-bit data (bits b1 to b4) of the frequency control data DDS. As described in FIGS. 23 and 24, high-order q-bit data (bits b13 to b20) of the n-bit data is input to the upper DACA, and low-order p-bit data (bits b5 to b12) is input to the lower DACB.

FIG. 26 is a diagram showing a first method of PWM modulation. DY and DZ denote high-order n-bit data of data DM, and are data in which the relation of DY=DZ+1 is established in n-bit expression.

In a case where a duty ratio expressed by low-order data of m=4 bits which is used for PWM modulation is, for example, 8 to 8, eight pieces of data DY of 16 bits and eight pieces of data DZ of 16 bits are output to the D/A converter 100 from the modulation circuit 90 in time division as shown in FIG. 26.

In addition, in a case where a duty ratio expressed by low-order data of m=4 bits is 10 to 6, ten pieces of data DY and six pieces of data DZ are output to the D/A converter 100 from the modulation circuit 90 in time division. Similarly, in a case where a duty ratio expressed by low-order data of m=4 bits is 14 to 2, 14 pieces of data DY and two pieces of data DZ are output in time division.

FIG. 27 is a diagram showing a second method of PWM modulation. In a case where each of bits b4, b3, b2, and b1 of m=4 bits that are used for PWM modulation is at a logic level "1", an output pattern (output pattern shown on the right side of each bit) which is associated with each bit in FIG. 27 is selected.

For example, in a case where the relation of bit b4=1 and the relation of b3=b2=b1=0 are established, only the output pattern associated with the bit b4 is output in periods P1 to P16. That is, data of n=16 bits is output to the D/A converter 100 from the modulation circuit 90 in time division in order of DZ, DY, DZ, . . . . Thereby, the number of times of output of each of the pieces of data DY and DZ is eight times, and PWM modulation similar to that in a case where a duty ratio is 8 to 8 in FIG. 26 is realized.

In addition, in a case where the relation of bit b4=b2=1 and the relation of b3=b1=0 are established, output patterns associated with the respective bits b4 and b2 are output in the periods P1 to P16. Thereby, the numbers of times of output of the respective pieces of data DY and DZ are ten times and six times, respectively, and PWM modulation similar to that in a case where a duty ratio is 10 to 6 is realized. Similarly, in a case where the relation of bit b4=b3=b2=1 and the relation of b1=0 are established, the numbers of times of output of the respective pieces of data DY and DZ are 14 times and twice, respectively, and PWM modulation similar to that in a case where a duty ratio is 14 to 2 is realized.

As described above, according to the modulation circuit 90 of FIGS. 5 and 23, it is possible to realize PWM modulation by only controlling the number of times of output of each of pieces of data DY and DZ, and to realize, for example, the resolution of 20 bits or greater of D/A conversion while using, for example, the D/A converter 100 having a resolution of 16 bits.

For example, in resistor string type or resistor ladder type D/A conversion with a little noise, for example, a resolution of approximately 16 bits is a substantial limit. In this respect, according to the configurations of FIGS. 5 and 23, it is possible to improve the resolution of D/A conversion to, for example, 20 bits or greater by only providing the modulation circuit 90 and the filter circuit 120 which have a small circuit size. Therefore, it is possible to improve the resolution of the D/A conversion unit 80 while minimizing an increase in a circuit size. It is possible to realize an increase in the accuracy of an oscillation frequency and to realize the suppression of frequency hopping and the provision of an oscillator appropriate for time synchronization by improving the resolution of the D/A conversion unit 80.

4.3 Temperature Sensor Unit, Oscillation Circuit

Figure 30:
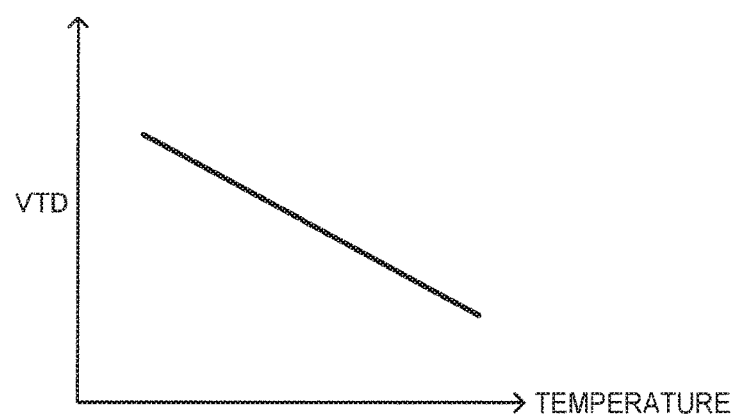
FIG. 30 is a diagram showing a temperature sensor unit.

FIG. 28 shows a first configuration example of the temperature sensor unit 10. The temperature sensor unit 10 of FIG. 28 includes a current source IST, and a bipolar transistor TRT having a collector to which a current applied from a current source IST is supplied. The bipolar transistor TRT is in a diode connection state in which the collector and abase are connected to each other, and a temperature detection voltage VTD having a temperature characteristic is output to a node of the collector of the bipolar transistor TRT. The temperature characteristic of the temperature detection voltage VTD is generated by temperature dependency of a voltage between the base and an emitter of the bipolar transistor TRT. As shown in FIG. 30, the temperature detection voltage VTD has a negative temperature characteristic (primary temperature characteristic having a negative gradient).

Figure 29:
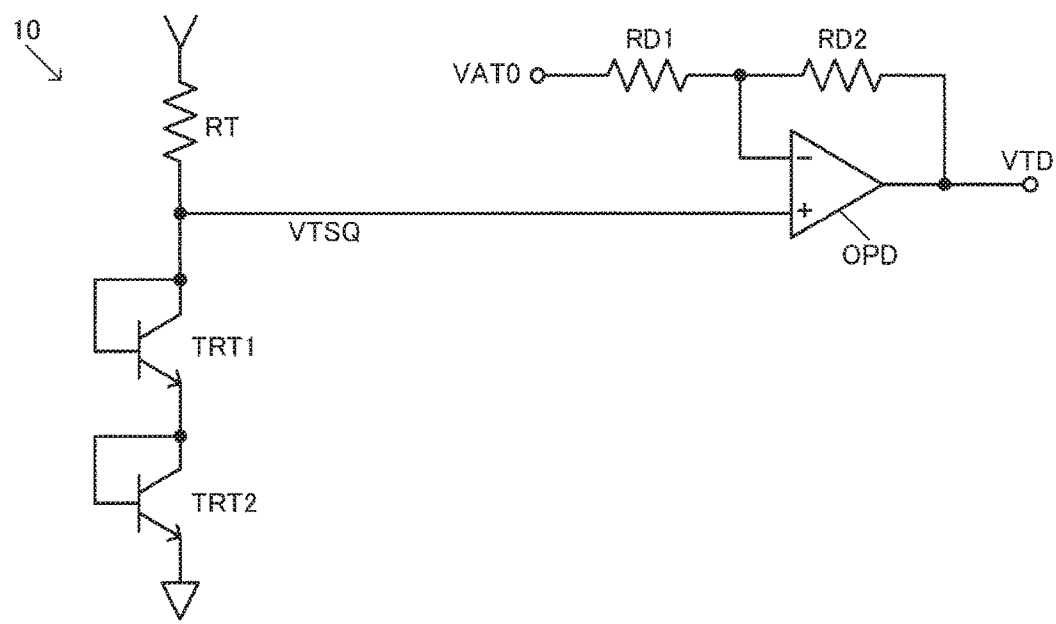
FIG. 29 shows an example of a detailed configuration of a temperature sensor unit.

FIG. 29 shows a second configuration example of the temperature sensor unit 10. In FIG. 29, a current source IST of FIG. 28 is realized by a resistor RT. One end of the resistor RT is connected to a node of a power supply voltage, and the other end thereof is connected to a collector of a bipolar transistor TRT1. In addition, an emitter of the bipolar transistor TRT1 is connected to a collector of a bipolar transistor TRT2. Both the bipolar transistors TRT1 and TRT2 are diode-connected, and a voltage VTSQ which is output to a node of the collector of the bipolar transistor TRT1 has a negative temperature characteristic (primary temperature characteristic having a negative gradient) as in FIG. 30.

In addition, in the temperature sensor unit 10 of FIG. 29, an operational amplifier OPD and resistors RD1 and RD2 are further provided. A voltage VTSQ is input to a non-inversion input terminal of the operational amplifier OPD, and one end of the resistor RD1 and one end of the resistor RD2 are connected to an inversion input terminal. A reference temperature voltage=0 is supplied to the other end of the resistor RD1, and the other end of the resistor RD2 is connected to an output terminal of the operational amplifier OPD.

An amplifier is configured to perform normal rotation amplification of the voltage VTSQ with a reference temperature voltage VAT0 as a standard by the operational amplifier OPD and the resistors RD1 and RD2. Thereby, a temperature detection voltage VTD=VAT0+(1+RD2/RD1)×(VTSQ−VAT0) is output from the temperature sensor unit 10. It is possible to adjust a reference temperature T0 by adjusting the reference temperature voltage VAT0.

Figure 31:
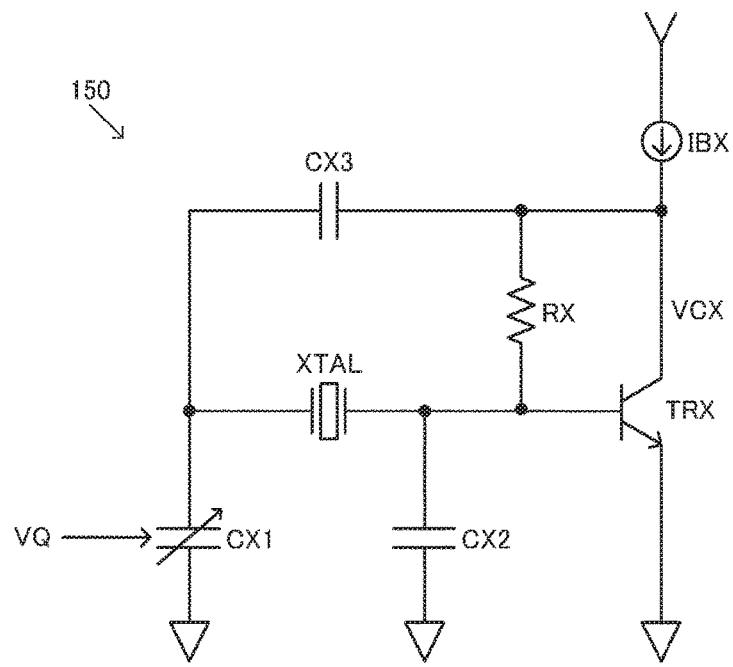
FIG. 31 shows an example of a detailed configuration of an oscillation circuit.

FIG. 31 shows a configuration example of the oscillation circuit 150. The oscillation circuit 150 includes a current source IBX, a bipolar transistor TRX, a resistor RX, a variable capacitor CX1, and capacitors CX2 and CX3.

The current source IBX supplies a bias current to a collector of the bipolar transistor TRX. The resistor RX is provided between the collector and a base of the bipolar transistor TRX.

One end of the variable capacitor CX1 having variable capacitance is connected to one end of a vibrator XTAL. Specifically, one end of the variable capacitor CX1 is connected to one end of the vibrator XTAL through a terminal for a first vibrator (pad for a vibrator) of the circuit device. One end of the capacitor CX2 is connected to the other end of the vibrator XTAL. Specifically, one end of the capacitor CX2 is connected to the other end of the vibrator XTAL through a terminal for a second vibrator (pad for a vibrator) of the circuit device. The capacitor CX3 is configured such that one end thereof is connected to one end of the vibrator XTAL and the other end thereof is connected to the collector of the bipolar transistor TRX.

A current between a base and an emitter, which is generated by the oscillation of the vibrator XTAL, is applied to the bipolar transistor TRX. An increase in the current between the base and the emitter leads to an increase in a current between the collector and the emitter of the bipolar transistor TRX and a decrease in a bias current branching from the current source IBX to the resistor RX, and thus a collector voltage VCX drops. On the other hand, a decrease in a current between the base and the emitter of the bipolar transistor TRX leads to a decrease in a current between the collector and the emitter and an increase in a bias current branching from the current source IBX to the resistor RX, and thus the collector voltage VCX rises. The collector voltage VCX is fed back to the vibrator XTAL through the capacitor CX3.

An oscillation frequency of the vibrator XTAL has temperature characteristics (for example, the temperature characteristics of FIG. 6), and the temperature characteristics are compensated for by an output voltage VQ (frequency control voltage) of the D/A conversion unit 80. That is, the output voltage VQ is input to the variable capacitor CX1, and a capacitance value of the variable capacitor CX1 is controlled by the output voltage VQ. When the capacitance value of the variable capacitor CX1 changes, a resonance frequency of an oscillation loop changes, and thus a fluctuation in an oscillation frequency due to the temperature characteristics of the vibrator XTAL is compensated for. The variable capacitor CX1 is realized by, for example, a variable capacitance diode (varactor) or the like.

Meanwhile, the oscillation circuit 150 of this embodiment is not limited to the configuration shown in FIG. 31, and can be modified in various ways. For example, an example of a case where CX1 is set to be a variable capacitor has been described in FIG. 31, but CX2 or CX3 may be set to be a variable capacitor controlled by an output voltage VQ. In addition, two or more of CX1 to CX3 may be set to be variable capacitors controlled by VQ.

5. Modification Example

Next, various modification examples of this embodiment will be described. For example, in the above, a description has been given of a case where the processing unit 50 outputs frequency control data DDS changing in units of k×LSB as shown in FIGS. 21 and 22 to thereby realize the method of this embodiment of FIGS. 11 to 13, but this embodiment is not limited thereto.

Figure 32:
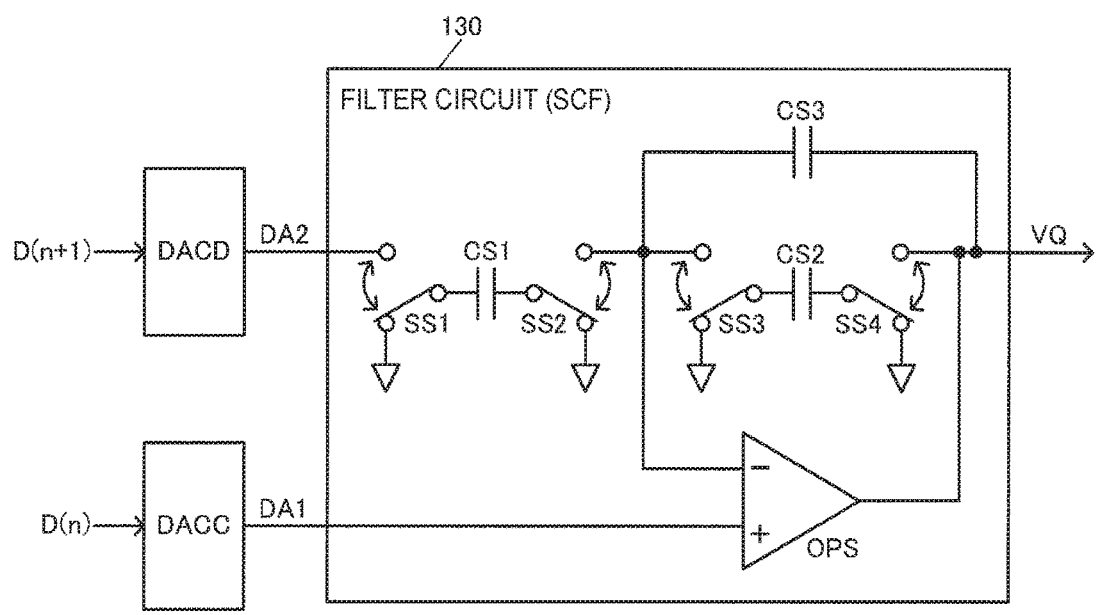
FIG. 32 is a diagram showing a modification example of this embodiment.

In a modification example of FIG. 32, a filter circuit 130 constituted by a switched capacitor filter (SCF) is provided at the rear stages of D/A converters DACC and DACD. For example, the D/A converter DACC of 8 bits outputs a voltage DA1 on the basis of data D(n) at a timing n. In addition, the D/A converter DACD of 8 bits outputs a voltage DA2 on the basis of data D(n+1) at the next timing n+1.

In a case where a clock frequency fck of the SCF of the filter circuit 130 is set, a resistor of RG=1/(CS1×fck) is realized by a circuit constituted by a capacitor CS1 and switch elements SS1 and SS2. A resistor of RF=1/(CS2×fck) is realized by a circuit constituted by a capacitor CS2 and switch elements SS3 and SS4.

In addition, a time constant τ of the filter circuit 130 is expressed by the following expression (12).

$$\tau = RF \times CS3 = (CS3/CS2) \times (1/fck) \tag{12}$$

Figure 34:
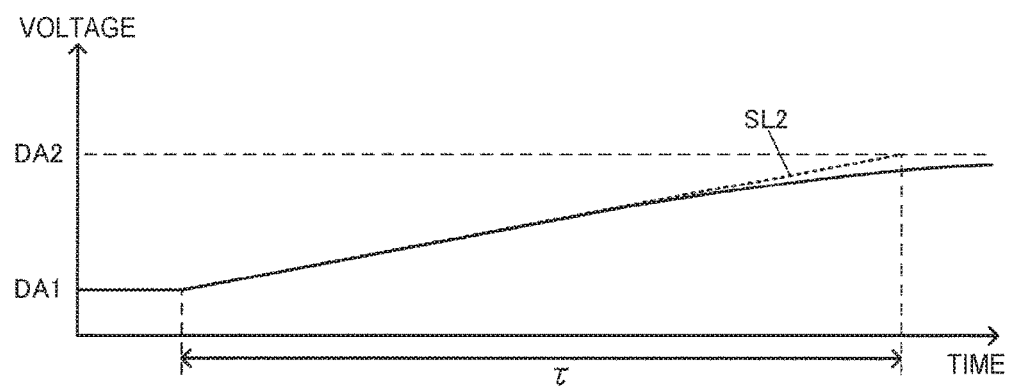
FIG. 34 is a diagram showing a modification example of this embodiment.

For example, the relation of τ=10 msec can be realized by establishing the relations of CS3=5 pF, CS2=0.1 pF, and fck=5 KHz. In this manner, it is possible to realize an output voltage VQ that slowly changes from a voltage DA1 to a voltage DA2 with a time constant τ as shown in FIG. 34 by sufficiently increasing the time constant τ.

Figure 33:
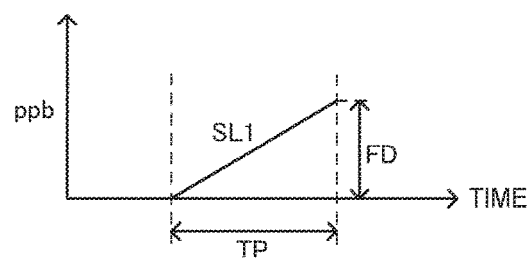
FIG. 33 is a diagram showing a modification example of this embodiment.

For example, as shown in FIG. 33, a slope in a case where the period TP (for example, 20 msec) described in FIG. 8 is set to be a horizontal axis and the permissible frequency drift FD (for example, approximately several ppb) is set to be a vertical axis is expressed by SL1=FD/TP. In this case, a slope SL2 realized by a time constant τ of FIG. 34 is made to be smaller than the slope SL1, and thus it is possible to realize the method of this embodiment of FIGS. 11 to 13. That is, the filter circuit 130, having such a strong low pass filter characteristic that the slope SL1 specified by the period TP and the permissible frequency drift FD cannot be created, is provided at the rear stages of the D/A converters DACC and DACD. Thereby, as indicated by C2 of FIG. 11, an output voltage VQ of the D/A conversion unit 80 can realize a voltage waveform which is the same as a voltage waveform changing with a step width of a voltage of 1 LSB, thereby allowing a problem of frequency hopping to be solved.

However, when the time constant τ of the filter circuit 130 becomes longer than the period TP, a fluctuation in temperature characteristics of a vibrator XTAL cannot be corrected by the output voltage VQ of the filter circuit 130, which results in a problem that a frequency is shifted.

Figure 35:
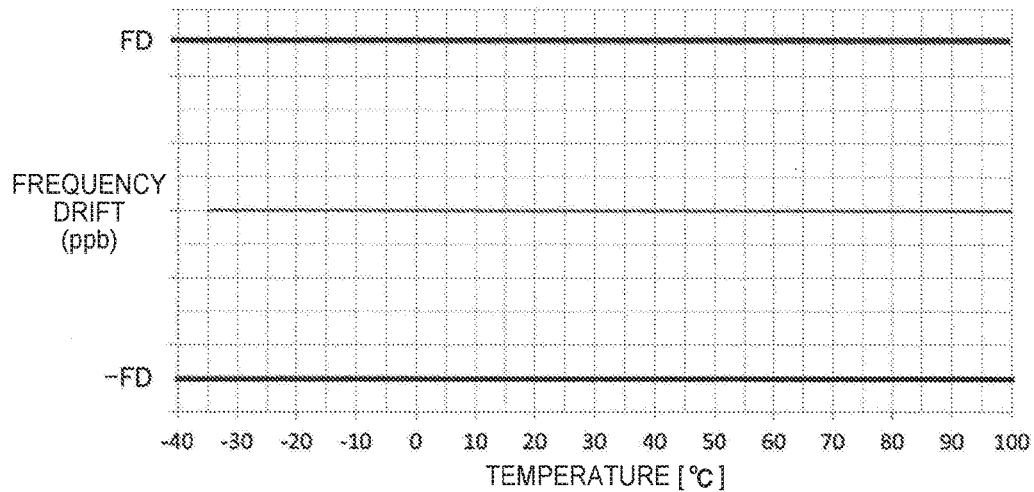
FIG. 35 is a diagram showing a frequency drift according to a modification example.
Figure 36:
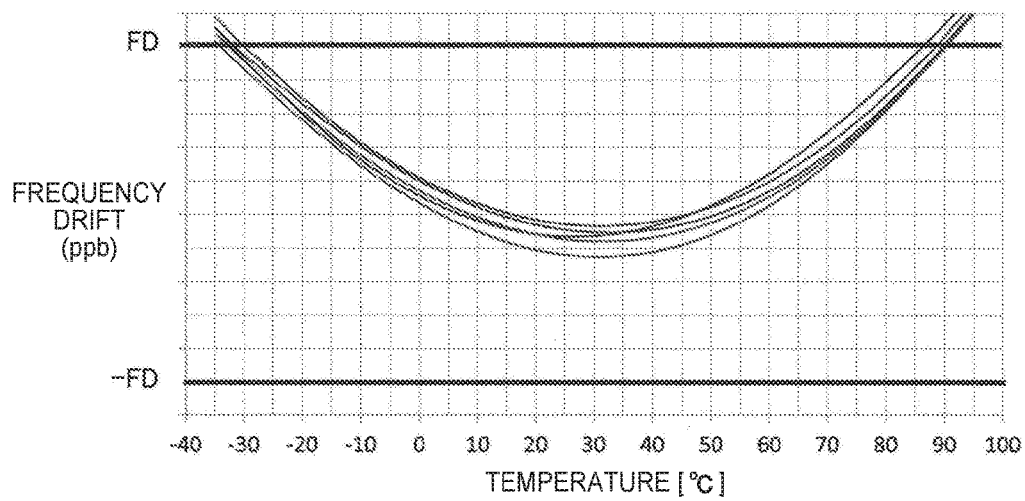
FIG. 36 is a diagram showing a frequency drift according to a modification example.
Figure 37:
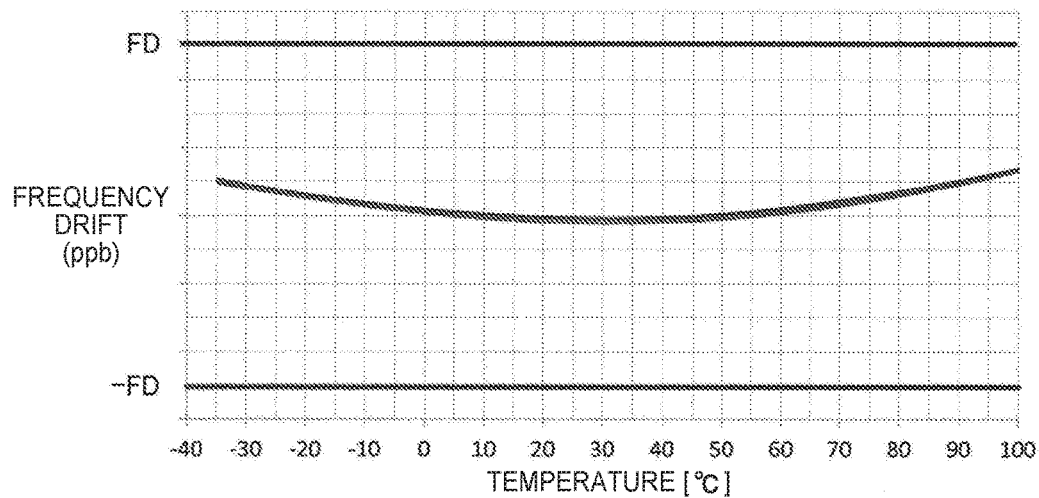
FIG. 37 is a diagram showing a frequency drift according to a modification example.

For example, FIG. 35 is a diagram showing a frequency drift with respect to a temperature change in a case where a time constant satisfies the relation of τ=TP=20 msec. As shown in FIG. 35, the relation of τ=TP is set, and thus it is possible to solve a problem of frequency hopping. On the other hand, FIGS. 36 and 37 are diagrams showing a frequency drift with respect to a temperature change in a case where the relation of τ=22 msec is established and a case where the relation of τ=40 msec is established. In this manner, in the modification example of FIG. 32, a problem that characteristics of a frequency drift are degraded when a time constant τ becomes longer occurs, and thus there is a disadvantage in that it is difficult to obtain an optimum solution.

Figure 38:
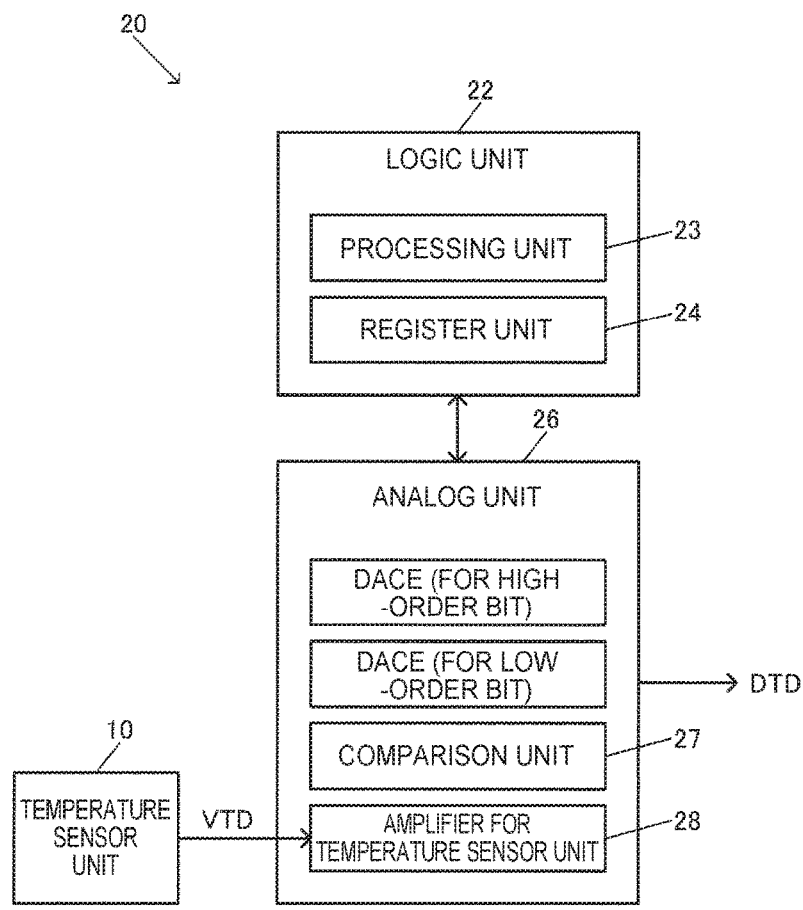
FIG. 38 shows an example of a detailed configuration of an A/D conversion unit.

FIG. 38 shows a configuration example of the A/D conversion unit 20. As shown in FIG. 38, the A/D conversion unit 20 includes a processing unit 23, a register unit 24, D/A converters DACE and DACF, a comparison unit 27. In addition, the A/D conversion unit may include an amplifier for temperature sensor unit 28. The processing unit 23 and the register unit 24 are provided as a logic unit 22, and the D/A converters DACE and DACF, the comparison unit 27, and the amplifier for temperature sensor unit 28 are provided as an analog unit 26.

The register unit 24 stores result data such as a halfway result and a final result of A/D conversion. The register unit 24 is equivalent to, for example, a successive comparison result register in a successive comparison method. The D/A converters DACE and DACF perform D/A conversion of the result data of the register unit 24. As DACE and DACF, a D/A converter having the same configuration as those in FIGS. 23 and 24 can be adopted. The comparison unit 27 compares output voltages of the D/A converters DACE and DACF with a temperature detection voltage VTD (voltage after amplification is performed by the amplifier for temperature sensor unit 28). The comparison unit 27 can be realized by, for example, a chopper type comparator or the like. The processing unit 23 performs a determination process on the basis of comparison results of the comparison unit 27, and performs a process of updating the result data of the register unit 24. The final temperature detection data DTD obtained by the updating process is output from the A/D conversion unit 20 as an A/D conversion result of the temperature detection voltage VTD. With such a configuration, for example, it is possible to realize A/D conversion using a successive comparison method, A/D conversion using a method similar to the successive comparison method, and the like. The method of this embodiment described in FIGS. 11 to 13 can be realized also by devising an output mode of temperature detection data DTD of the A/D conversion unit 20 of FIG. 38.

6. Oscillator, Electronic Apparatus, Vehicle

Figure 39:
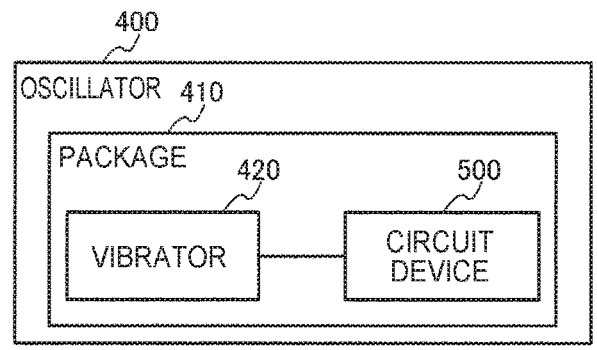
FIG. 39 shows a configuration example of an oscillator.

FIG. 39 shows a configuration example of the oscillator 400 including the circuit device 500 of this embodiment. As shown in FIG. 39, the oscillator 400 includes a vibrator 420 and a circuit device 500. The vibrator 420 and the circuit device 500 are mounted within a package 410 of the oscillator 400. A terminal of the vibrator 420 and a terminal (pad) of the circuit device 500 (IC) are electrically connected to each other through internal wirings of the package 410.

Figure 40:
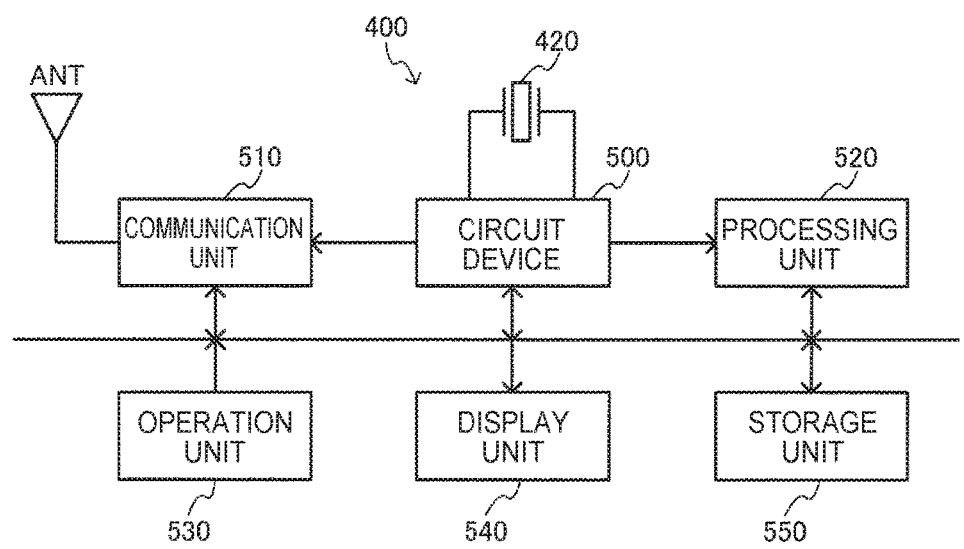
FIG. 40 shows a configuration example of an electronic apparatus.

FIG. 40 shows a configuration example of an electronic apparatus including the circuit device 500 of this embodiment. The electronic apparatus includes the circuit device 500 of this embodiment, the vibrator 420 such as a quartz crystal vibrator, an antenna ATN, a communication unit 510, and a processing unit 520. In addition, the electronic apparatus may include the operation unit 530, the display unit 540, and the storage unit 550. The oscillator 400 is constituted by the vibrator 420 and the circuit device 500. Meanwhile, the electronic apparatus is not limited to the configuration shown in FIG. 40, and may be modified in various ways such as the omission of some components or the addition of other components.

Examples of the electronic apparatus of FIG. 40 may include various assumable devices such as a GPS built-in timepiece, a wearable device such as a biological information measurement device (a sphygmograph, a pedometer, or the like) or a head mounted display device, a portable information terminal (mobile terminal) such as a smartphone, a cellular phone, a portable game machine, a notebook PC, or a tablet PC, a content providing terminal that distributes contents, video equipment such as a digital camera or a video camera, and a network-related device such as a base station or a router.

The communication unit 510 (wireless circuit) performs a process of receiving and transmitting data from and to the outside through the antenna ATN. The processing unit 520 performs a process of controlling an electronic apparatus, a variety of digital processing of data transmitted and received through the communication unit 510, and the like. The function of the processing unit 520 can be realized by a processor such as a microcomputer.

The operation unit 530 is used for a user to perform an input operation, and can be realized by operation buttons, a touch panel display, or the like. The display unit 540 displays various pieces of information, and can be realized by a display such as a liquid crystal or an organic EL. Meanwhile, in a case where a touch panel display is used as the operation unit 530, the touch panel display functions as both the operation unit 530 and the display unit 540. The storage unit 550 stores data, and the function thereof can be realized by a semiconductor memory such as a RAM or a ROM, a hard disk drive (HDD), or the like.

Figure 41:
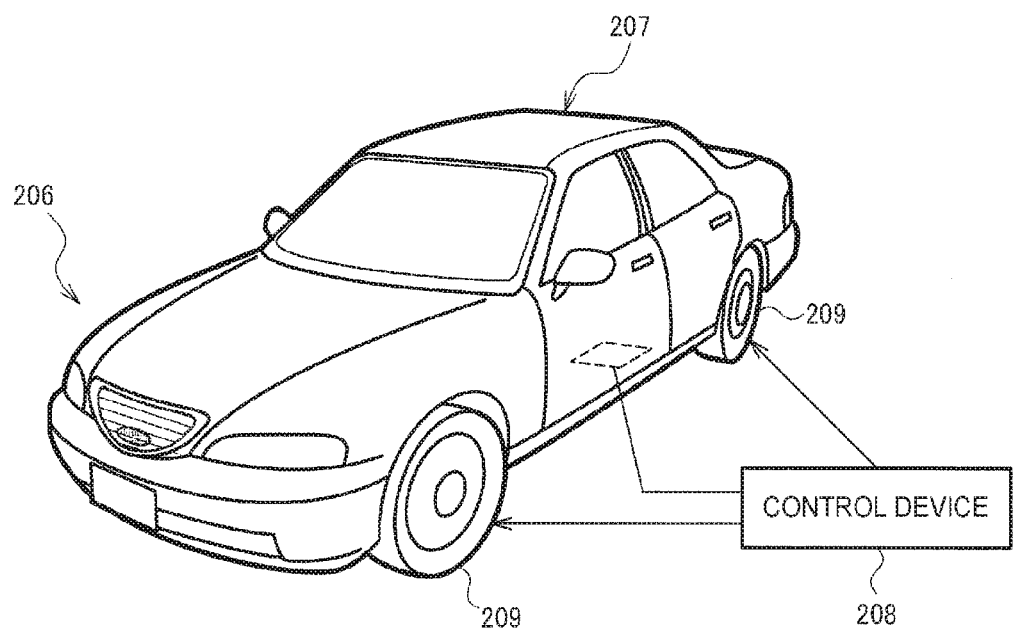
FIG. 41 shows a configuration example of a vehicle.

FIG. 41 shows an example of a vehicle including the circuit device of this embodiment. The circuit device (oscillator) of this embodiment can be incorporated into various vehicles such as a car, an airplane, a motorbike, a bicycle, or a ship. The vehicle is a device or an apparatus which is provided with, for example, a driving mechanism such as an engine or a motor, a steering mechanism such as a handle or a rudder, and various electronic apparatuses (on-vehicle devices), and moves on the ground, in the air, and in the sea. FIG. 41 schematically shows an automobile 206 as a specific example of the vehicle. An oscillator (not shown) including the circuit device and the vibrator of this embodiment is incorporated into the automobile 206. A control device 208 is operated in response to a clock signal generated by the oscillator. The control device 208 controls the stiffness and softness of a suspension or a brake of each of car wheels 209 in accordance with, for example, the posture of a car body 207. For example, the automatic driving of the automobile 206 may be realized by the control device 208. Meanwhile, a device having the circuit device or the oscillator of this embodiment incorporated thereinto is not limited to the control device 208, and can be incorporated into various devices (on-vehicle devices) provided in a vehicle such as the automobile 206.

Although this embodiment has been described as above in detail, it can be easily understood by a person skilled in the art that various modifications without substantially departing from the new matters and effects of the invention are possible. Therefore, these modifications are all included in the scope of the invention. For example, in the specification or the drawings, the terminologies mentioned at least once along with different terminologies having broader meanings or the same meanings may be replaced with the different terminologies in any location of the specification or the drawings. In addition, all of the combinations of this embodiment and the modifications are included in the scope of the invention. In addition, configurations and operations of the circuit device, the oscillator, the electronic apparatus, and the vehicle, the D/A conversion method, the method of processing frequency control data, the method of outputting frequency control data of the processing unit, the method of outputting a voltage of the D/A conversion unit, the method of controlling a frequency of the vibrator, and the like are also not limited to the above description of the present embodiment, and may have various modifications.

The entire disclosures of Japanese Patent Application Nos. 2015-211252, filed Oct. 27, 2015 and 2016-099724, filed May 18, 2016 are expressly incorporated by reference herein.

What is claimed is:

1. A circuit device comprising:
an A/D conversion unit that performs A/D conversion of a temperature detection voltage applied from a temperature sensor unit and outputs temperature detection data;
a processing unit that performs a temperature compensation process of an oscillation frequency based on the temperature detection data and outputs frequency control data of the oscillation frequency; and
an oscillation signal generation circuit that generates an oscillation signal having the oscillation frequency which is set based on the frequency control data, using the frequency control data received from the processing unit and a vibrator,
wherein the oscillation signal generation circuit includes
a D/A conversion unit that performs D/A conversion of the frequency control data received from the processing unit, and
an oscillation circuit that generates the oscillation signal using an output voltage of the D/A conversion unit and the vibrator, and
wherein the D/A conversion unit includes
a modulation circuit that receives the frequency control data of i=(n+m) bits from the processing unit and modulates n-bit data of the frequency control data based on m-bit data of the frequency control data,
a D/A converter that performs D/A conversion of the modulated n-bit data, and
a filter circuit that smooths the output voltage of the D/A converter.

2. The circuit device according to claim 1,
wherein a relation of $\Delta f/fs < 1/10^6$ is established in a case where a sampling frequency of the D/A conversion unit is set to be fs and a change in the oscillation frequency due to one D/A conversion of the D/A conversion unit is set to be $\Delta f$.

3. The circuit device according to claim 2,
wherein a relation of $\Delta f/fs < 1/10^6$ is established when a relation of $fs \geq 1$ kHz is established, and
wherein a relation of $\Delta f < 1$ mHz is established when a relation of $fs < 1$ kHz is established.

4. The circuit device according to claim 1,
wherein a relation of $\Delta f < 1$ mHz is established when a relation of $fs < 1$ kHz is established in a case where a sampling frequency of the D/A conversion unit is set to be fs and a change in the oscillation frequency due to one D/A conversion of the D/A conversion unit is set to be $\Delta f$.

5. The circuit device according to claim 1,
wherein the vibrator is a quartz crystal vibrator.

6. The circuit device according to claim 5,
wherein the quartz crystal vibrator is an AT cut vibrator, an SC cut vibrator, or a SAW resonator.

7. The circuit device according to claim 1,
wherein the processing unit outputs the frequency control data changing from first data corresponding to first temperature to second data corresponding to second temperature in units of k×LSB (k≥1) in a case where temperature changes from the first temperature to the second temperature.

8. The circuit device according to claim 2,
wherein the processing unit outputs the frequency control data changing from first data corresponding to first temperature to second data corresponding to second temperature in units of k×LSB (k≥1) in a case where temperature changes from the first temperature to the second temperature.

9. The circuit device according to claim 3,
wherein the processing unit outputs the frequency control data changing from first data corresponding to first temperature to second data corresponding to second temperature in units of k×LSB (k≥1) in a case where temperature changes from the first temperature to the second temperature.

10. The circuit device according to claim 4,
wherein the processing unit outputs the frequency control data changing from first data corresponding to first temperature to second data corresponding to second temperature in units of k×LSB (k≥1) in a case where temperature changes from the first temperature to the second temperature.

11. The circuit device according to claim 7,
wherein the processing unit
compares the first data which is arithmetic operation result data of the temperature compensation process of the last time with the second data which is arithmetic operation result data of the temperature compensation process of this time,
outputs addition result data as the frequency control data while performing a process of adding a predetermined value to the first data until the addition result data reaches the second data, in a case where the second data is larger than the first data, and
outputs subtraction result data as the frequency control data while performing a process of subtracting a predetermined value from the first data until the subtraction result data reaches the second data, in a case where the second data is smaller than the first data.

12. The circuit device according to claim 9,
wherein the processing unit
compares the first data which is arithmetic operation result data of the temperature compensation process of the last time with the second data which is arithmetic operation result data of the temperature compensation process of this time,
outputs addition result data as the frequency control data while performing a process of adding a predetermined value to the first data until the addition result data reaches the second data, in a case where the second data is larger than the first data, and
outputs subtraction result data as the frequency control data while performing a process of subtracting a predetermined value from the first data until the subtraction result data reaches the second data, in a case where the second data is smaller than the first data.

13. The circuit device according to claim 11,
wherein the processing unit includes
an arithmetic operation unit that performs an arithmetic operation of the temperature compensation process of the oscillation frequency based on the temperature detection data and outputs the arithmetic operation result data of the temperature compensation process, and
an output unit that receives the arithmetic operation result data from the arithmetic operation unit and outputs the frequency control data, and
wherein the output unit outputs the frequency control data changing from the first data to the second data in units of k×LSB in a case where the arithmetic operation result data changes from the first data corresponding to the first temperature to the second data corresponding to the second temperature.

14. The circuit device according to claim 12, wherein the processing unit includes
    an arithmetic operation unit that performs an arithmetic operation of the temperature compensation process of the oscillation frequency based on the temperature detection data and outputs the arithmetic operation result data of the temperature compensation process, and
    an output unit that receives the arithmetic operation result data from the arithmetic operation unit and outputs the frequency control data, and
wherein the output unit outputs the frequency control data changing from the first data to the second data in units of k×LSB in a case where the arithmetic operation result data changes from the first data corresponding to the first temperature to the second data corresponding to the second temperature.

15. The circuit device according to claim 1, wherein the processing unit outputs the frequency control data at an output rate higher than an output rate of the temperature detection data received from the A/D conversion unit.

16. The circuit device according to claim 1, wherein the D/A conversion unit outputs the output voltage changing with a step width of a voltage corresponding to k×LSB (k≥1) in a case where a minimum resolution of data in D/A conversion is set to be LSB.

17. The circuit device according to claim 11, wherein a relation of k=1 is established.

18. An oscillator comprising:
the circuit device according to claim 1; and
the vibrator.

19. An electronic apparatus comprising:
the circuit device according to claim 1.

20. A vehicle comprising:
the circuit device according to claim 1.

* * * * *